United States Patent
Cheng et al.

(10) Patent No.: US 9,590,393 B2
(45) Date of Patent: Mar. 7, 2017

(54) COMPLEMENTARY METAL OXIDE SEMICONDUCTOR DEVICE WITH III-V OPTICAL INTERCONNECT HAVING III-V EPITAXIAL SEMICONDUCTOR MATERIAL FORMED USING LATERAL OVERGROWTH

(71) Applicant: INTERNATIONAL BUSINESS MACHINES CORPORATION, Armonk, NY (US)

(72) Inventors: Cheng-Wei Cheng, White Plains, NY (US); Ning Li, White Plains, NY (US); Devendra K. Sadana, Pleasantville, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/095,599

(22) Filed: Apr. 11, 2016

(65) Prior Publication Data

US 2016/0226222 A1 Aug. 4, 2016

Related U.S. Application Data

(63) Continuation of application No. 14/509,601, filed on Oct. 8, 2014, now Pat. No. 9,344,200.

(51) Int. Cl.
*H01L 31/0232* (2014.01)
*H01S 5/30* (2006.01)
(Continued)

(52) U.S. Cl.
CPC ........ *H01S 5/3013* (2013.01); *G02B 6/12004* (2013.01); *G02B 6/1228* (2013.01);
(Continued)

(58) Field of Classification Search
CPC ...... H01L 31/173; H01L 31/184; H01L 31/18
(Continued)

(56) References Cited

U.S. PATENT DOCUMENTS

| 4,989,934 A | 2/1991 | Zavracky et al. |
| 5,815,520 A | 9/1998 | Furushima |

(Continued)

FOREIGN PATENT DOCUMENTS

| CN | 102487046 A | 6/2012 |
| DE | 19941875 C2 | 3/2002 |

(Continued)

OTHER PUBLICATIONS

List of IBM Patents or Patent Applications Treated as Related dated Apr. 11, 2016, 2 pages.
(Continued)

*Primary Examiner* — Sonya D McCall Shepard
(74) *Attorney, Agent, or Firm* — Tutunjian & Bitetto, P.C.; Louis J. Percello

(57) ABSTRACT

An electrical device that includes a first semiconductor device positioned on a first portion of a substrate and a second semiconductor device positioned on a third portion of the substrate, wherein the first and third portions of the substrate are separated by a second portion of the substrate. An interlevel dielectric layer is present on the first, second and third portions of the substrate. The interlevel dielectric layer is present over the first and second semiconductor devices. An optical interconnect is positioned over the second portion of the semiconductor substrate. At least one material layer of the optical interconnect includes an epitaxial material that is in direct contact with a seed surface within the second portion of the substrate through a via extending through the least one interlevel dielectric layer.

20 Claims, 10 Drawing Sheets

(51) Int. Cl.

| | | |
|---|---|---|
| *H01L 31/173* | (2006.01) | |
| *H04B 10/80* | (2013.01) | |
| *G02B 6/12* | (2006.01) | |
| *G02B 6/122* | (2006.01) | |
| *G02B 6/13* | (2006.01) | |
| *G02B 6/132* | (2006.01) | |
| *G02B 6/136* | (2006.01) | |
| *H01L 27/12* | (2006.01) | |
| *H01S 5/026* | (2006.01) | |
| *H01S 5/343* | (2006.01) | |

(52) U.S. Cl.
CPC ............ *G02B 6/131* (2013.01); *G02B 6/132* (2013.01); *G02B 6/136* (2013.01); *H01L 27/1203* (2013.01); *H01L 31/0232* (2013.01); *H01L 31/173* (2013.01); *H01S 5/0262* (2013.01); *H01S 5/343* (2013.01); *H04B 10/801* (2013.01)

(58) Field of Classification Search
USPC ....................................... 257/432, 84, 85, 98
See application file for complete search history.

(56) References Cited

U.S. PATENT DOCUMENTS

| | | |
|---|---|---|
| 6,326,645 B1 | 12/2001 | Kadota |
| 6,493,497 B1 | 12/2002 | Ramdani et al. |
| 6,759,688 B2 | 7/2004 | Preston et al. |
| 7,251,389 B2 | 7/2007 | Lu et al. |
| 8,110,823 B2 | 2/2012 | Bowers |
| 8,183,134 B2 | 5/2012 | Wu et al. |
| 8,290,014 B2 | 10/2012 | Junesand et al. |
| 8,299,351 B2 | 10/2012 | Hsu |
| 8,421,055 B2 | 4/2013 | Kunert et al. |
| 8,525,201 B2 | 9/2013 | Lee et al. |
| 8,530,342 B2 | 9/2013 | Pan |
| 2004/0232430 A1 | 11/2004 | Lempkowski et al. |
| 2005/0025909 A1 | 2/2005 | Jurgensen et al. |
| 2007/0170417 A1 | 7/2007 | Bowers |
| 2008/0149936 A1 | 6/2008 | Joblot et al. |
| 2010/0044719 A1 | 2/2010 | Yu et al. |
| 2010/0078680 A1 | 4/2010 | Cheng et al. |
| 2012/0019902 A1 | 1/2012 | Williams et al. |
| 2013/0022072 A1 | 1/2013 | Bowers |
| 2013/0112939 A1 | 5/2013 | Chen et al. |
| 2013/0140525 A1 | 6/2013 | Chen et al. |

FOREIGN PATENT DOCUMENTS

| | | |
|---|---|---|
| JP | 01120012 A | 5/1989 |
| JP | 03247597 A | 11/1991 |
| JP | 08195356 A | 7/1996 |
| WO | 2009110806 A1 | 9/2009 |

OTHER PUBLICATIONS

U.S. Appl. No. 14/509,601, filed Oct. 8, 2014.
Li, J. et al., "Monolithic Integration of GaAs/InGaAs Lasers on Virtual Ge Substrates via Aspect-Ratio Trapping," Journal of the Electrochemical Society, May 13, 2009, vol. 156, Issue 5. (pp. H574-H578).
Roelkens, G., et al., "III-V/silicon Photonics for On-Chip and Intra-Chip Optical Interconnects."

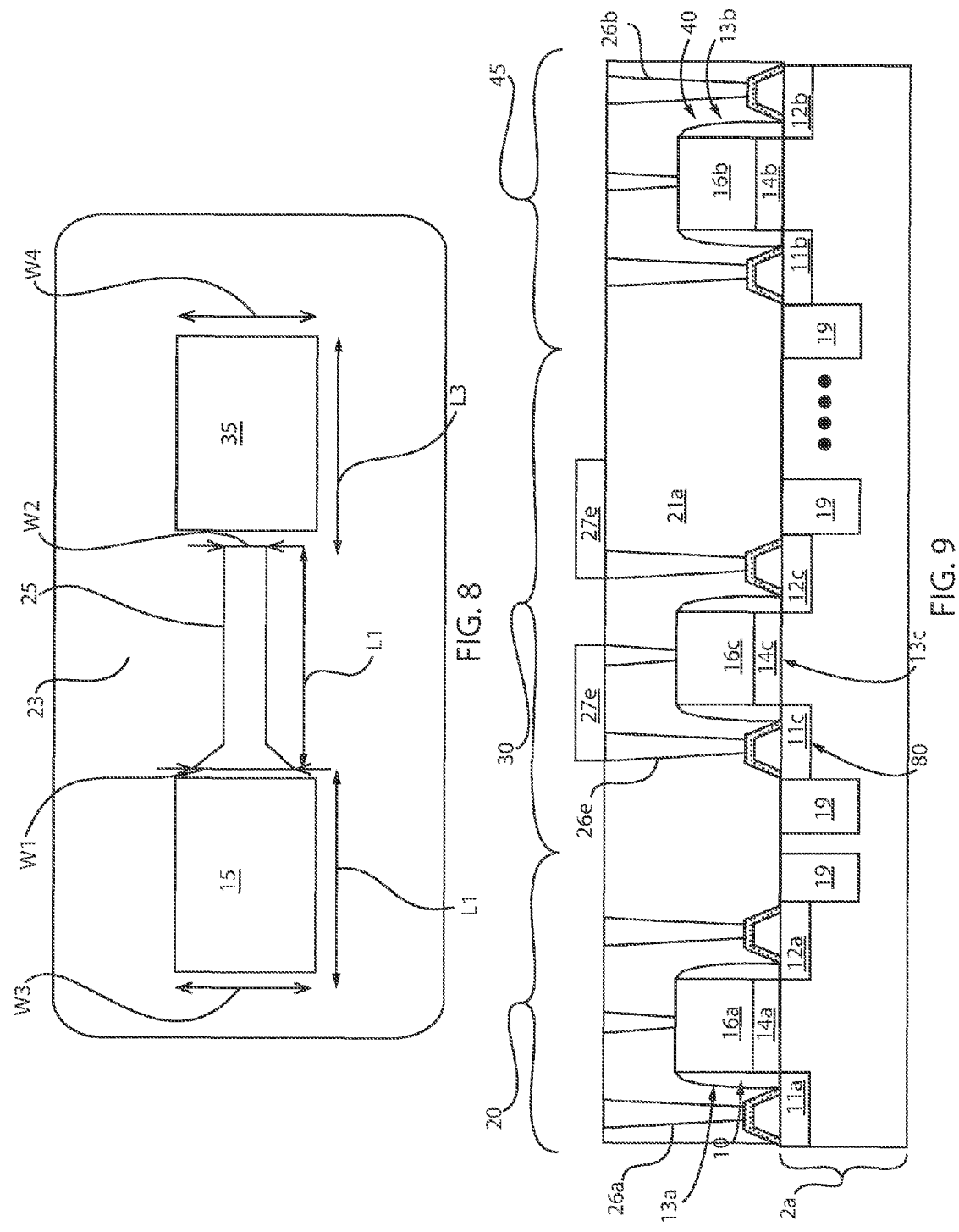

COMPLEMENTARY METAL OXIDE SEMICONDUCTOR DEVICE WITH III-V OPTICAL INTERCONNECT HAVING III-V EPITAXIAL SEMICONDUCTOR MATERIAL FORMED USING LATERAL OVERGROWTH

BACKGROUND

Technical Field

The present disclosure relates to semiconductor devices, such as optoelectronic devices composed of III-V semiconductor materials.

Description of the Related Art

The dimensions of semiconductor field effect transistors (FETs) have been steadily shrinking over the last thirty years or so, as scaling to smaller dimensions leads to continuing device performance improvements. With increasing scaling of semiconductor devices, the interconnects have also been decreasing in size. Typically, as the interconnect size has decreased, the resistance of the interconnects has increased. With increased scaling of semiconductor devices leading to increased switching speeds, the obstruction to further performance enhancements is the speed at which data signals can be transmitted over interconnects.

SUMMARY

In one aspect, an electrical device is provided that includes a first semiconductor device positioned on a first portion of a semiconductor on insulator (SOI) substrate, and a second semiconductor device positioned on a third portion of a SOI substrate. An optical interconnect is positioned on a second portion of the SOI substrate that is present between the first and third portions of the SOI substrate, wherein the optical interconnect is formed on at least one interlevel dielectric layer that is present over at least one of the first and second semiconductor devices. The optical interconnect includes a III-V light emission device, a dielectric waveguide and a III-V light detection device, wherein at least one material layer of at least one of the III-V light emission device and the III-V light detection device is an epitaxial material that is in direct contact with the base semiconductor substrate of the SOI substrate through a via extending through the least one interlevel dielectric layer and a buried dielectric layer of the SOI substrate.

In another embodiment, an electrical device is provided that includes a first semiconductor device positioned on a first portion of a substrate, and a second semiconductor device positioned on a third portion of the substrate. The first and third portions of the substrate are separated by a second portion of the substrate. An interlevel dielectric layer is present on the first, second and third portions of the substrate, wherein the interlevel dielectric layer is present over the first and second semiconductor devices. An optical interconnect is positioned over the second portion of the semiconductor substrate. At least one material layer of the optical interconnect is an epitaxial material that is in direct contact with a seed surface within the second portion of the substrate through a via extending through the least one interlevel dielectric layer.

In another aspect, a method of forming an electrical device is provided that includes forming a first semiconductor device on a first portion of a substrate, and forming a second semiconductor device on a third portion of the substrate. The first and third portions of the substrate are separated by a second portion of the substrate. At least one interlevel dielectric layer is formed over the first, second and third portions of the substrate, wherein at least the first and second semiconductor devices are covered by the at least one interlevel dielectric layer. At least one via is formed through the at least one interlevel dielectric to expose a seed substrate surface in the second portion of the substrate. An optical interconnect is formed on a surface of the at least one interlevel dielectric layer overlying the second portion of the substrate, wherein at least one material layer of the optical interconnect is epitaxial grown from the seed substrate surface through at least one via extending onto the upper surface of the at least one interlevel dielectric layer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 8. is a top down view illustrating the structure that is depicted in FIG. 7.

FIG. 9 is a side cross-sectional view depicting semiconductor devices that have been formed on a bulk semiconductor substrate following back end of the line (BEOL) processing, in accordance with another embodiment of the present disclosure.

DETAILED DESCRIPTION OF THE PREFERRED EMBODIMENTS

Figure 1:
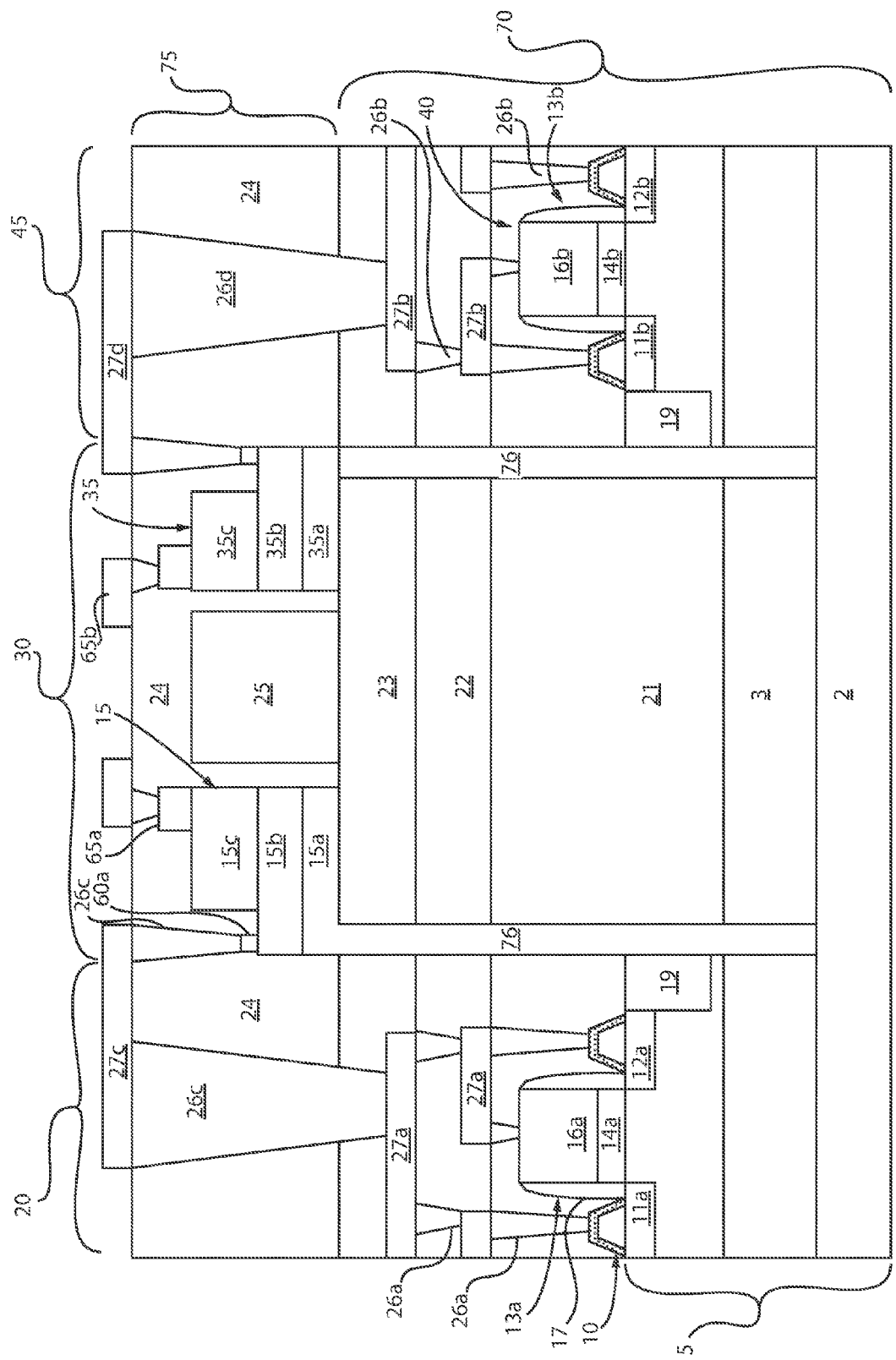
FIG. 1 is a side cross-sectional view depicting an electrical device including two semiconductor devices present on a semiconductor on insulator (SOI) substrate, in which data transmission between the two semiconductor devices includes an optical interconnect, in accordance with one embodiment of the present disclosure

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact", "directly on" and "contacting" mean that a first element, such as a first structure, and a second element, such as a second structure, are connected without any intermediary conducting, insulating or semiconductor layers at the interface of the two elements.

In some embodiments, the methods and structures disclosed herein provide optoelectronic devices, e.g., an optoelectronic light emission device and an optoelectronic light detection device, which are composed of III-V semiconductor materials, and function as an optical interconnect in the transmission of data from one semiconductor device to another across semiconductor substrate that may include material layers of type IV semiconductor compositions. It has been determined that data transmission across physical electrical communication structures, such as vias, lines, and bus bars, is slow when compared to data transmission using optical interconnects, i.e., data via transmission of light signals. In some embodiments, the methods and structures disclosed herein replace the bus-bar that typically provides for electrical communication between semiconductor devices in a complementary metal oxide semiconductor (CMOS) arrangement with an optical interconnect to increase the speed of data transmission to and from the semiconductor devices present on the substrate.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In some embodiments, the semiconductor device may be a field effect transistor (FET). As used herein a "field effect transistor" is a transistor in which output current, i.e., source-drain current, is controlled by the voltage applied to the gate. A field effect transistor has three terminals, i.e., gate, source and drain. It is noted that the field effect transistor is only one type of semiconductor device that is within the scope of the present disclosure, and it is not intended that the semiconductor devices employed in the methods and structures of the present disclosure be limited to only FETs. For example, the semiconductor devices may be any switching device including, but not limited to, fin field effect transistor (FinFET), metal oxide semiconductor field effect transistor (MOSFET), bipolar junction transistor (BJT), Schottky barrier semiconductor device, junction field effect transistor (JFET), and combinations thereof. In other examples, the semiconductor device may be a memory device. As used herein, the term "memory device" means a structure in which the electrical state can be altered and then retained in the altered state, in this way a bit of information can be stored. Examples of memory devices that may be employed in the present disclosure include flash memory, dynamic random access memory and combinations thereof.

In some embodiments, the semiconductor devices may be configured in complementary metal-oxide-semiconductor (CMOS) arrangement. The word "complementary" refer to the fact that the typical digital design style with CMOS uses complementary and symmetrical pairs of p-type and n-type metal oxide semiconductor field effect transistors (MOSFETs) for logic functions. CMOS technology is used in microprocessors, microcontrollers, static RAM, and other digital logic circuits. CMOS technology is also used for several analog circuits such as image sensors (CMOS sensor), data converters, and highly integrated transceivers for many types of communication.

The optical interconnects disclosed herein include at least one optoelectronic light emission device for emitting a data signal using an emission of light, and at least one optoelectronic light detection device for receiving the data signal being transmitted by the optoelectronic light emission device as an emission of light.

As used herein, the term "optoelectronic light emission device" denotes a semiconductor light emitting structure, such as a laser diode. The laser diode is an electrically pumped semiconductor laser in which the active medium is formed by a p-n junction of a semiconductor diode similar to that found in a light-emitting diode. A laser diode is electrically a p-i-n diode. The active region of the laser diode is in the intrinsic (I) region, and the carriers, electrons and holes, are pumped into it from the N and P regions (n-type doped regions or p-type doped regions) respectively, also referred to herein as the first III-V semiconductor material layer and second III-V semiconductor material layer.

In some embodiments, the optoelectronic light emission device may be a quantum well laser. A quantum well laser is a laser diode in which the active region of the device is so narrow that quantum confinement occurs. If the middle layer, i.e., active region, of the laser is made thin enough, it acts as a quantum well. This means that the vertical variation of the electron's wavefunction, and thus a component of its energy, is quantized. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes, and at least a second semiconductor layer with a band gap greater than that of the first semiconductor layer. The term "band gap" refers to the energy difference between the top of the valance band (i.e., Ev) and the bottom of the conduction band (i.e., Ec). A QW structure can be formed by sandwiching a semiconductor thin layer of a narrow band gap between semiconductor layers of a large band gap. Lasers containing more than one quantum well layer are known as multiple quantum well lasers.

If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers. Optoelectronic light emission devices including both type I and type II quantum wells are within the scope of the present disclosure.

The term "waveguide" as used herein, denotes a structure that receives light signals from a first optoelectronic device, e.g., optoelectronic light emission device, and directs the light signal to a second optoelectronic device, e.g., optoelectronic light detection device. Examples of materials that are suitable for the dielectric waveguide include, without limitation, silicon oxides (e.g., doped or undoped silicon dioxide, $SiO_2$), silicon nitride, silicon oxynitride, silicon carbide, hafnium oxide, aluminum oxide, and silica.

The term "optoelectronic light detection device" as used herein, denotes a semiconductor containing photodetector. For example, the optoelectronic light detection device may be composed of a III-V semiconductor material, such as GaInAs, and may function as an infrared detector. Detection of a light signal may include conversion of the light signal into an electrical signal. GaInAs photodiodes are example of an optoelectronic light detection device in accordance with the present disclosure that may be used to detect wavelengths ranging from 1.1 µm to 1.7 µm. In other embodiments, the photodetector may be composed of III-V semiconductor materials that can be employed for detection of telecom wavelengths, i.e., wavelengths ranging from 1.31 µm to 1.55 µm. In some embodiments, the optoelectronic light detection device can be a III-V pin photodetector. For example, the III-V pin photodetector may include a p-type conductivity semiconductor layer, e.g., p-InGaAs layer, at least one intrinsic semiconductor layer, e.g., i-InGaAs layer, and an n-type conductivity semiconductor layer, e.g., n-InGaAs layer. In one example, the III-V pin photodetector may be provided by an i-InGaAs layer serving as the intrinsic absorption layer that is sandwiched between an n-InP layer and a p-InGaAs layer. The n-type and p-type conductivity layers that are on opposing sides of the intrinsic absorption layer in a III-V pin photodetector may be referred to as cladding layers.

Further details regarding the above described optoelectronic devices, e.g., optoelectronic light emission device and optoelectronic light detection device, semiconductor devices and waveguides are now described with reference to FIGS. 1-13.

FIG. 1 depicts one embodiment of an electrical device that including an optical interconnect 15, 25, 35 forming on a semiconductor on insulator (SOI) substrate 5. The SOI substrate 5 typically includes at least one type IV semiconductor material layer. The term "type IV" as used to describe a semiconductor material means that the semiconductor material is in Group IV of the Periodic Table of Elements (Group 14 in accordance with the IUPAC system). As will be described below, the type IV semiconductor material that provides the seed surface for later described epitaxially grown III-V semiconductor materials is typically composed of a silicon containing material, but the present disclosure is not limited to only this example, as germanium containing substrates and silicon carbide containing substrates are also within the scope of the present disclosure. Any substrate material that meets the definition of a type IV semiconductor substrate is within the scope of the present disclosure.

In one embodiment, the SOI substrate 5 typically includes a semiconductor on insulator (SOI) layer 4 that is present on a buried dielectric layer 3, wherein the buried dielectric layer 3 is present on a base semiconductor substrate 2. The SOI layer 4 of the SOI substrate 5 may be composed of any type IV semiconductor material, such as silicon, monocrystalline silicon, polycrystalline silicon, silicon germanium, monocrystalline silicon germanium, polycrystalline silicon germanium, silicon doped with carbon (Si:C), silicon carbide, silicon germanium doped with carbon (SiGe:C) and combinations thereof. In other embodiments, the SOI layer 4 may be composed of a type III-V semiconductor material, such as, GaAs, InAs, InP as well as other III/V and II/VI compound semiconductors. The SOI layer 4 may have a thickness ranging from 10 nm to 250 nm. In some embodiments, in which the SOI layer 4 is an extremely thin SOI layer (ETSOI layer), the thickness of the SOI layer 4 may be less than 10 nm.

The buried dielectric layer 3 may be composed of any oxide, nitride or oxynitride dielectric material. For example, when the buried dielectric layer 3 is an oxide, the buried dielectric layer 3 may be composed of silicon oxide. In another example, when the buried dielectric layer 3 is a nitride, the buried dielectric layer 3 may be silicon nitride. The thickness of the buried dielectric layer 3 may range from 10 nm to 250 nm. The base semiconductor substrate 2 may be composed of any type IV semiconductor material including, but not limited to Si, strained Si, SiC, SiGe, SiGeC, Si alloys, Ge, Ge alloys and combinations thereof. In other embodiments, the base semiconductor substrate 2 may be composed of a type III-V semiconductor material, such as, GaAs, InAs, InP as well as other III/V and II/VI compound semiconductors. The base semiconductor layer 2 may have the same or a different composition than the SOI layer 4.

A first portion 20 of the SOI substrate 5 contains a first semiconductor device 10. A second portion 30 of the SOI substrate 5 contains an optical interconnect, which includes an optoelectronic light emission device 15, a dielectric waveguide 25, and an optoelectronic light detection device

35. A third portion 45 of the SOI substrate 5 contains a second semiconductor device 40.

The first and second semiconductor devices 10, 40 may be any switching or memory type device, as described above. In the embodiment that is depicted in FIG. 1, the first and second semiconductor devices 10, 40 each include a source region 11a, 11b, and a drain region 12a, 12b on opposing sides of a gate structure 13a, 13b. In some embodiments, the source and drain regions 11a, 11b, 12a, 12b are formed, i.e., present, within a remaining portion of the SOI layer 4 in each of the first and third portions 20, 45 of the SOI substrate 5. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. The gate structures 13a, 13b typically include at least one gate dielectric 14a, 14b that is present on the channel region portion of the semiconductor device, and at least one gate conductor 16a, 16b.

The conductivity type of the source and drain regions 11a, 11b, 12a, 12b typically dictates the conductivity type of the semiconductor device 10, 40 to which the source and drain regions 11a, 11b, 12a, 12b correspond. The term "conductivity type" denotes whether a semiconductor material has been doped to an n-type or p-type conductivity. As used herein, "p-type" refers to the addition of impurities to an intrinsic semiconductor that creates deficiencies of valence electrons. In a type IV semiconductor material, such as the SOI layer 4 of the SOI substrate 5, examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as the SOI layer 4 of the SOI substrate 5, examples of n-type dopants, i.e., impurities, include but are not limited to antimony, arsenic and phosphorous.

In some embodiments, the first semiconductor device 10 may have a source region 11a and a drain region 12a doped to an n-type conductivity, i.e., first conductivity type, to provide an n-type FET, i.e., first conductivity FET, and the second semiconductor device 40 may have a source region 11b and drain region 12b doped to a p-type conductivity, i.e., second conductivity type to provide a p-type FET, i.e., second conductivity FET. In some embodiments, the first semiconductor device 10 may have a source region 11a and a drain region 12a doped to a p-type conductivity, i.e., first conductivity type, to provide a p-type FET, and the second semiconductor device 40 may have a source region 11b and drain region 12b doped to an n-type conductivity, i.e., second conductivity type to provide an n-type FET. In some examples, when the first semiconductor device 10 has a first conductivity type, and the second semiconductor device 40 has a second conductivity type that is different from the first conductivity type, the first and second semiconductor devices 10, 40 may be referred to as being in a CMOS arrangement.

The at least one gate dielectric 14a, 14b for each of the gate structures 13a, 13b for the first semiconductor device 10 and the second semiconductor device 40 can be comprised of a semiconductor oxide, semiconductor nitride, semiconductor oxynitride, or any multilayered stack thereof. In one example, the at least one gate dielectric 14a, 14b can be comprised of a semiconductor oxide such as, e.g., silicon dioxide. The at least one gate dielectric 14a, 14b can also be comprised of a dielectric metal oxide having a dielectric constant that is greater than the dielectric constant of silicon dioxide, e.g., 3.9. The dielectric constants that are described herein are measured at room temperature, i.e., 25° C., at atmospheric pressure, i.e., 1 atm. In one embodiment, the at least one gate dielectric 14a, 14b can comprise a dielectric oxide having a dielectric constant greater than 4.0. In another embodiment, the at least one gate dielectric 14a, 14b can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed as the at least one gate dielectric layer 14a, 14b. For example, the at least one gate dielectric 14a, 14b can include a stack of, from bottom to top, silicon dioxide and hafnium oxide.

The at least one gate conductor 16a, 16b may be composed of conductive materials including, but not limited to metals, metal alloys, metal nitrides and metal silicides, as well as laminates thereof and composites thereof. In one embodiment, the at least one gate conductor 16a, 16b may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The at least one gate conductor 16a, 16b may also comprise doped polysilicon and/or polysilicon-germanium alloy materials (i.e., having a dopant concentration from $1 \times 10^{18}$ dopant atoms per cubic centimeter to $1 \times 10^{22}$ dopant atoms per cubic centimeter) and polycide materials (doped polysilicon/metal silicide stack materials).

A gate sidewall spacer 17 may be present on the sidewall of the gate structures 13a, 13b. The gate sidewall spacer 17 may be composed of an oxide, nitride, or oxynitride material.

Referring to FIG. 1, the first and second semiconductor devices 10, 40 are typically covered by at least one interlevel dielectric layer 21, 22, 23, 24. The at least one interlevel dielectric layer 21, 22, 23, 24 may extend across an entirety of the SOI substrate 5, wherein the at least one interlevel dielectric layer 21, 22, 23, 24 is present in each of the first portion 20, second portion 30 and third portion 45 of the SOI substrate 5. The composition of each layer in the plurality of the interlevel dielectric layers 21, 22, 23, 24 is selected to allow for selective etching between the adjacent dielectric layers during the formation of later described interconnect wiring. Compositions that are suitable for the interlevel dielectric layers may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamondlike carbon (DLC), also known as amorphous hydrogenated carbon, α-C:H). Additional choices for the interlevel dielectric layer 21, 22, 23, 24 include any of the aforementioned materials in porous form, or in a form that changes during processing to or from being porous and/or permeable to being non-porous and/or non-permeable.

In some embodiments, the interlevel dielectric layers identified by reference numbers 21, 22, 23 provide a first level 70 of the electrical device in which the first and second semiconductor devices 10, 40 are present. As will be described in greater detail below, the optical interconnect composed of the optoelectronic light emission device 15, dielectric waveguide 25, and optoelectronic light detection device 35 is positioned on an upper surface of the upper most interlevel dielectric layer 23 of the first level 70. The optical interconnect is covered with an interlevel dielectric layer identified by reference number 24, and present in a second level 75 of the electrical device. As depicted in FIG. 1, the optical interconnect that is present in the second level 75 of the electrical device is laterally offset from the first and second semiconductor devices 10, 40 that are present in the first level 70 of the electrical device.

The second portion 30 of the SOI substrate 5 has been processed to provide the optical interconnect providing for data transmission between the first and second semiconductor devices 10, 40, wherein the optical interconnect includes the optoelectronic light emission device 15, the dielectric waveguide 25, and the optoelectronic light detection device 35. In some embodiments, at least base material layers for the optoelectronic light emission device 15 and the optoelectronic light detection device 35 of the optical interconnect are formed using an epitaxial growth process, in which epitaxial material is grown from a seed surface of the SOI substrate 5 through a via 76 that extends through the interlevel dielectric layers 21, 22, 23 of the first level 70, wherein the epitaxial material extends from the opening of the via 76 laterally over and in direct contact with the uppermost interlevel dielectric layer 23 of the first level 70. In some embodiments, the via 76 also extends through the buried dielectric layer 3 of the SOI substrate 5 to expose a portion of the base semiconductor substrate 2 to provide the seed surface for epitaxial growth of the material for at least the base material layers for the optoelectronic light emission device 15 and the optoelectronic light detecting device 35. In some embodiments, at least one via 76 that is filled with epitaxial material is present at the interface between the first portion 20 of the SOI substrate 5 and the second portion 30 of the SOI substrate 5. In some embodiments, at least one via 76 that is filled with epitaxial material is present at the interface between the second portion 30 of the SOI substrate 5 and the third portion 45 of the SOI substrate 5.

In some embodiments, the optoelectronic light emission device 15 may be a laser diode composed of III-V compound semiconductors. As used herein, the term "III-V compound semiconductor" denotes a semiconductor material that includes at least one element from Group III of the Periodic Table of Elements (Group 13 in accordance with the IUPAC system), and at least one element from Group V of the Periodic Table of Elements (Group 15 in accordance with the IUPAC system).

Examples of III-V compound semiconductor materials that can be employed in the material layers of the optoelectronic light emission device 15 include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Laser diodes are formed in compound semiconductor materials, such as III-V semiconductor materials, that are able to emit light. In one embodiment, the laser diode that provides the optoelectronic light emission device 15 includes a first conductivity type III-V semiconductor material layer 15a that is present directly on the upper surface of the uppermost interlevel dielectric layer 23 of the first level 70 of the electronic device, a stacked structure of quantum wells 15b comprising III-V semiconductor material layers that is present on the first conductivity type III-V semiconductor material layer 15a, and a second conductivity type III-V semiconductor material layer 15b that is present on the stacked structure of quantum wells 12.

The optoelectronic light emission device 15 depicted in FIG. 1 is a quantum well laser, in which the wavelength of the light emitted by the quantum well laser is determined by the width of the active region rather than just the bandgap of the material from which it is constructed. The first and second conductivity type III-V semiconductor material layers 15a, 15c, which may also be referred to as cladding layers, typically are doped to a first conductivity type and an opposing second conductivity type. For example, the first conductivity type III-V semiconductor material layer 15a may be doped to a first conductivity, e.g., n-type conductivity, and the second conductivity type III-V semiconductor material layer 15c may be doped to a second conductivity, e.g., p-type conductivity.

In some embodiments, the first and second conductivity type III-V semiconductor material layers 15a, 15c function to pump charge carriers, i.e., electron and hole charge carriers, into the intrinsic active area provided by the quantum well. In some examples, the first conductivity type III-V semiconductor material layer 15a may be composed of InP, GaAs, AlGaAs, InAlAs or a combination thereof. The dopant that provides the conductivity type, i.e., first type conductivity, e.g., n-type, of the first conductivity type III-V semiconductor material layer 15a may be present in a concentration ranging from $10^{17}$ atoms/cm$^3$ to $10^{20}$ atoms/cm$^3$. In some examples, the first conductivity type III-V semiconductor material layer 15a may have a thickness ranging from 100 nm to 2000 nm. In some embodiments, the second conductivity type III-V semiconductor material layer 15b may be composed of InP or GaAs or AlGaAs or InAlAs. The dopant that provides the conductivity type, i.e., second type conductivity, e.g., p-type, of the second conductivity type III-V semiconductor material layer 15b may be present in a concentration ranging from $10^{17}$ atoms/cm$^3$ to $10^{20}$ atoms/cm$^3$. In some examples, the second conductivity type III-V semiconductor material layer 15c may have a thickness ranging from 100 nm to 2000 nm. It is noted that the above compositions and thicknesses are provided for illustrative purposes only, and are not intended to limit the present disclosure. For example, the first and second conductivity type III-V semiconductor material layers 15a, 15c may be composed of any III-V compound semiconductor composition provided above.

The active region of the laser diode is in the intrinsic (I) region. By "intrinsic" it is meant that the region is not doped with an extrinsic dopant, e.g., n-type or p-type dopant, such as the dopants used to dope the first and second conductivity type III-V semiconductor material layers 15a, 15c. The active region in the quantum well structure 15b is formed by alternating layers of relatively low bandgap material and layers of relatively high bandgap material. As used herein, a "low bandgap" is a bandgap ranges from 0.5 eV to 3.0 eV, and a "high bandgap" ranges from 1.0 eV to 3.5 eV. The former layers are termed "well layers" and the latter layers are termed "barrier layers." For example, the active low bandgap layers comprised $Al_rGa_{1-r}As$ and the passive high bandgap layers comprised $Al_zGa_{1-z}As$ with r<z.

To provide the stacked structure of quantum wells 15b, the thickness of each layer of III-V compound semiconductor material within the quantum well 15b may be no greater than 50 nm. For example, the thickness for each layer of the III-V compound semiconductor material within the quantum well 15b may range from 5 nm to 10 nm. In some embodiments, the stacked structure of quantum wells 15b may be composed of 1 to 100 layers of semiconductor material, such as III-V compound semiconductor material. In yet another embodiment, the stacked structure of quantum wells 15b may be composed of 1 to 5 layers of semiconductor material. In some embodiments, the quantum well (QW) layers and barrier layers of the quantum well structure 15b are formed of a semiconductor material, such as $In_xGa_{1-x}As_yP_{1-y}$, $In_xGa_{1-x}As$, $In_xGa_{1-x}N_yAs_{1-y}$, $In_xGa_{1-x}As_ySb$ (here, 0.0<x<1.0, 0.0<y<1.0).

Referring to FIG. 8, the optoelectronic light emission device 15 may have a width W3 ranging from 3 microns to 5 microns. The width W3 dimension of the optoelectronic light emission device 15 is along a dimension perpendicular to the direction along which the optoelectronic light emission device 15 emits a beam of light. In some embodiments, the width W3 may range from 3.75 microns to 4.25 microns, and in one example is equal to 4 microns. The length L2 of the optoelectronic light emission device 15 may range from approximately 50 microns to approximately 100 microns. In one example, the length L2 of the optoelectronic light emission device 15 may be approximately 80 microns.

Referring to FIG. 1, in some embodiments, the end of the active portion of the SOI layer 4 that provides the source or drain region 11a, 12a of the first semiconductor device 10 is separated, and electrically isolated, from the via 27 of the epitaxial material to the optical interconnect by an isolation dielectric material 19. The isolation dielectric material 19 may be composed of any dielectric material. In some examples, the isolation dielectric material 19 may composed of an oxide, such as silicon oxide ($SiO_2$). In another example, the isolation dielectric material 19 may be composed of a nitride, such as silicon nitride. It is noted that the above examples are provided for illustrative purposes only, and that other dielectric compositions may be suitable for the isolation dielectric material 19.

The dielectric wave guide 25 is positioned in direct contact with an upper surface of the uppermost interlevel dielectric layer 23 and is positioned between the optoelectronic light emission device 15 and the optoelectronic light detecting device 35 in the second portion 20 of the SOI substrate 5. The dielectric waveguide 25 is present overlying the buried dielectric layer 3 of the SOI substrate 5, wherein at least three interlevel dielectric layers 21, 22, 23 are present between the dielectric waveguide 25 and the buried dielectric layer 3 of the SOI substrate 5.

Typically, the function of the dielectric wave guide 25 is to receive the beam of light being emitted from the optoelectronic light emission device 15 and to transmit that beam of light to the optoelectronic light detection device 35. In some embodiments, the dielectric wave guide 25 is composed of a dielectric material that is selected from the group consisting of silicon oxide, silicon nitride, silicon oxynitride, silicon carbide, hafnium oxide, aluminum oxide, aluminum nitride, amorphous silicon, silica and combinations thereof. The dielectric wave guide 25 typically has a tapered geometry, as depicted in FIG. 8. By "tapered" it is meant that the width of the dielectric wave guide 25 decreases along one direction from a first end of the dielectric wave guide 25 to a second end of the dielectric wave guide 25. For example, in some embodiments, the face of the dielectric wave guide 25 that is proximate to, and receives the light from the optoelectronic light emission device 15, is typically greater in width W1 than the width W2 of the face of the dielectric wave guide 25 that transmits the light to optoelectronic light detection device 35. The width of the dielectric wave guide 25 may taper gradually at a consistent rate, or the taper of the dielectric wave guide 25 may have regions in which the rate that the width of the dielectric wave guide 25 decreases is greater than the taper in other portions of the dielectric wave guide 25. In one example, the width W1 of the face of the dielectric wave guide 25 that receives the light beam from the optoelectronic light emission device 15 may range from 4 microns to 16 microns. In another embodiment, the width W1 of the face of the dielectric wave guide 25 that is adjacent to the face of the optoelectronic light emission device 15 ranges from 6 microns to 10 microns, e.g., the width W1 of the face of the dielectric wave guide 15 adjacent to the optoelectronic light emitted device 15 may be 8 microns. In one example, the width W2 of the face of the dielectric wave guide 15 that emits the light beam may range from 1 micron to 8 microns. In another example, the width W2 of the face of the dielectric wave guide 15 that emits the light beam and is adjacent to the optoelectronic light detection device 35 ranges from 1 micron to 5 microns.

Referring to FIG. 8, the dielectric wave guide 25 is positioned to have a length L1 along the direction that light is being emitted from the optoelectronic light emission device 15. The length L1 of the dielectric wave guide 25 is positioned to be align the light being emitted from the optoelectronic light emission device 15 to the optoelectronic light detection device 35. In this manner, the dielectric wave guide 25 is substantially aligned with the light being emitted from the optoelectronic light emission device 15 and is substantially aligned to direct the light received from the optoelectronic light emission device 15 to the optoelectronic light detection device 35. The length L1 of the dielectric wave guide 25 may range from 50 microns to 100 microns. In some embodiments, the length L1 of the dielectric wave guide 25 may range from 60 microns to 90 microns. For example, the length L1 of the dielectric wave guide 25 may be 80 microns.

The distance separating the emission face of the optoelectronic light emission device 15 from the receiving face of the dielectric wave guide 25 may range from 100 nm to 300 nm. In one example, the distance separating the optoelectronic light emission device 15 from the emission face of the dielectric wave guide 25 is equal to 200 nm. The distance separating the emission face of the optoelectronic light detection device 35 from the emitting face of the dielectric wave guide 25 may range from 100 nm to 300 nm. In one example, the distance separating the optoelectronic light detection device 35 from the receiving face of the dielectric wave guide 25 is equal to 200 nm.

Referring to FIG. 1, the optoelectronic light detection device 35 is present within the second portion 30 of the SOI substrate 5 on the opposing side of the dielectric waveguide 25 that the optoelectronic light emission device 15 is present on. The optoelectronic light detection device 35 may be a photodetector composed of III-V compound semiconductors. Examples of III-V compound semiconductor materials that can be employed in the material layers of the optoelectronic light detection device 35 include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. The photodetector converts the light signal into electrical signal. If the light is modulated at the emitter, the photodetector reconstructs this modulation back into the electrical domain.

In some embodiments, the optoelectronic light detection device 35 includes a first conductivity type III-V semiconductor layer 35a, an intrinsic III-V semiconductor material layer 35b, and a second conductivity type III-V semiconductor material layer 35c. The first conductivity type III-V semiconductor material layer 35a may be composed of an epitaxial material that is epitaxially grown from the semiconductor seed surface of the SOI substrate 5. The epitaxial material for the first conductivity type III-V semiconductor material layer 35a may be grown from the semiconductor seed surface to fill the via 76, and extend from the opening to the via 76 over the upper surface of the uppermost interlevel dielectric layer 23 of the first level 70 of the electrical device. In this manner, the first conductivity type III-V semiconductor material layer 35a may be the base material layer of the optoelectronic light detection device 35.

The first conductivity type III-V semiconductor material layer 35a of the optoelectronic light detection device 35 may be doped to an n-type conductivity. The n-type dopant that may be present in the first conductivity type III-V semiconductor material layer 35a in a concentration ranging from $1\times10^{17}$ cm$^{-3}$ to $1\times10^{20}$ cm$^{-3}$. In some embodiments, the composition of the first conductivity type III-V semiconductor material layer 35a may be selected from the group consisting of GaAs, InP, AlGaAs, InAlAs, and combinations thereof. The first conductivity type III-V semiconductor material layer 35a may have a thickness ranging from 1.0 micron to 2.0 microns.

The intrinsic III-V semiconductor material layer 35b of the optoelectronic light detection device 35 is typically undoped, but may include some unintentional dopant from the first and second conductivity type III-V semiconductor material layers 35a, 35c that results from diffusion effects. The maximum concentration of n-type or p-type dopant that may unintentionally be present in the intrinsic III-V semiconductor material layer 35b can be equal to $5\times10^{16}$ cm$^3$. The intrinsic III-V semiconductor material layer 35b may be composed of at least one of GaAs, InP, AlGaAs, InAlAs and combinations thereof. The intrinsic III-V semiconductor material layer 35b may be composed of a single composition or may be a multi-layered structure of multiple compositions. The thickness of the III-V semiconductor material layer 35b may range from 10 nm to 1000 nm. The intrinsic III-V semiconductor material layer 35b may be present directly on an upper surface of the first conductivity type III-V semiconductor material layer 35a.

The second conductivity type III-V semiconductor material layer 35c of the optoelectronic light detection device 35 may have an opposite conductivity type of the first conductivity type III-V semiconductor material layer 35a. For example, the second conductivity type III-V semiconductor material layer 35c may have a p-type conductivity. The p-type dopant that may be present in the second conductivity type III-V semiconductor material layer 35c in a concentration ranging from $1\times10^{17}$ cm$^{-3}$ to $1\times10^{20}$ cm$^{-3}$. In some embodiments, the composition of the second conductivity type III-V semiconductor material layer 35c may be selected from the group consisting of GaAs, InP, AlGaAs, InAlAs, and combinations thereof. The second conductivity type III-V semiconductor material layer 35c may have a thickness ranging from 1.0 micron to 2.0 microns. The second conductivity type III-V semiconductor material layer 35c is present in direct contact with the second intrinsic III-V semiconductor layer 35b.

Referring to FIG. 8, the optoelectronic light detection device 35 may have a width W4 ranging from 3 microns to 5 microns. The width W4 dimension of the optoelectronic light detection device 35 is along a dimension perpendicular to the direction along which the optoelectronic light detection device 15 emits a beam of light. In some embodiments, the width W4 may range from 3.75 microns to 4.25 microns, and in one example is equal to 4 microns. The length L3 of the optoelectronic light detection device 35 may range from approximately 50 microns to approximately 100 microns. In one example, the length L3 of the optoelectronic light detection device 35 may be approximately 80 microns.

The third portion 45 of the SOI substrate 5 includes the second semiconductor device 40. The second semiconductor device 40 has been described above, and may have a conductivity type that is opposite the conductivity type of the first semiconductor device 10. For example, when the first semiconductor device 10 has an n-type conductivity, the second semiconductor device 40 has a p-type conductivity, and when the first semiconductor device 10 has a p-type conductivity, the second conductivity semiconductor device 40 has an n-type conductivity. As depicted in FIG. 1, the second semiconductor device 40 may be a field effect transistor (FET) that includes a gate structure 13b, source region 11b and drain region 12b. The description of the source region 11b, drain region 12b and the gate structure 13b including the at least one gate conductor 16b and the at least one gate dielectric 12b has been provided above. The source and drain regions 11b, 12b of the second semiconductor device 40 has been formed in the portion of the SOI layer 4 that is present within the third portion 45 of the SOI substrate 5. Referring to FIG. 1, in some embodiments, the end of the active portion of the SOI layer 4 that provides the source or drain region 11b, 12b of the second semiconductor device 40 is separated, and electrically isolated, from the sidewall of the optoelectronic light detection device 35 by an isolation dielectric material 19.

In some embodiments, the end of the active portion of the SOI layer 4 that provides the source or drain region 11b, 12b of the second semiconductor device 40 is separated, and electrically isolated, from the via 27 of the epitaxial material to the optical interconnect by an isolation dielectric material 19. The isolation dielectric material 19 may be composed of any dielectric material. In some examples, the isolation dielectric material 19 may composed of an oxide, such as silicon oxide ($SiO_2$). In another example, the isolation dielectric material 19 may be composed of a nitride, such as silicon nitride. It is noted that the above examples are provided for illustrative purposes only, and that other dielectric compositions may be suitable for the isolation dielectric material 19.

The electrical device further includes a plurality of interlevel dielectric layers 21, 22, 23, 24 over the optical interconnect 15, 25, 35, as well as the first and second semiconductor devices 10, 40. The interlevel dielectric layers 21, 22, 23, 24 are formed for device isolation, and are a part of the process for forming the interconnect wiring, i.e., vias 26a, 26b, 26c, 26d and lines 27a, 27b, 27c, 27d that provide for electrical communication to the semiconductor devices, e.g., first and second semiconductor devices 10, 40, that are present on the SOI substrate 5. The interconnect wiring, i.e., vias 26a, 26c and lines 27a, 27c, that are present in the first portion 20 and the second portion 30 of the SOI substrate 5 also provide for electrical communication between the first semiconductor device 10 and the optoelectronic light emission device 15. The interconnect wiring, i.e., vias 26b, 26d and lines 27b, 27d, in the second portion 30 and third portion 45 of the SOI substrate 5 provide for electrical communication between the optoelectronic light detection device 35 and the second semiconductor device 40.

The interconnect wiring, i.e., vias 26b and lines 27b, may be composed of an electrically conductive material. "Electrically conductive" as used through the present disclosure means a material typically having a room temperature conductivity of greater than $10^{-8} (\Omega\text{-m})^{-1}$. For example, the interconnect wiring may be composed of a conductive metal. The conductive metal may include, but is not limited to, tungsten, copper, aluminum, silver, gold and alloys thereof.

Figure 2:
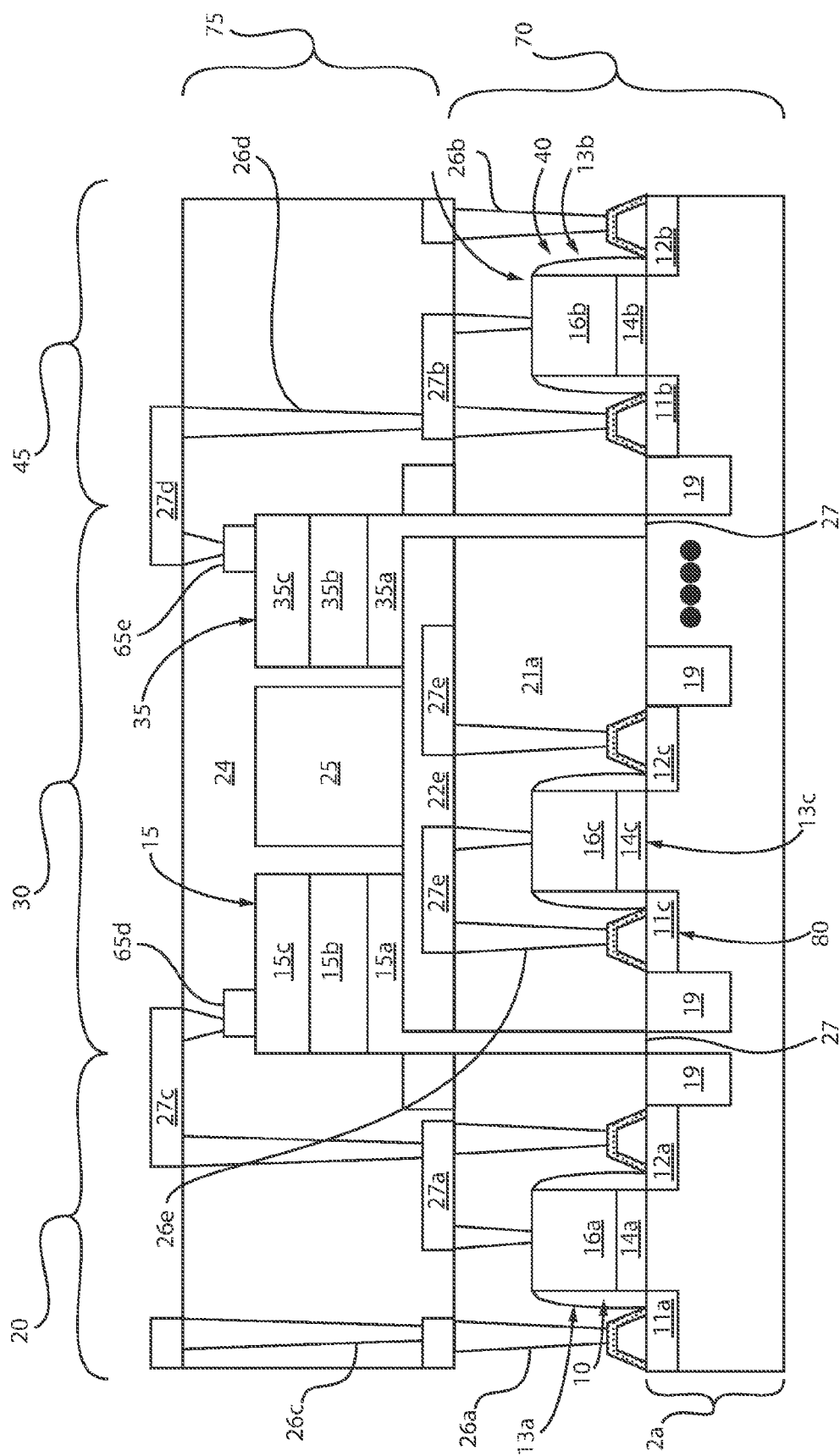
FIG. 2 is a side cross-sectional view depicting an electrical device including three semiconductor devices present on a bulk semiconductor substrate, in which data transmission between at least two of the semiconductor devices includes an optical interconnect, in accordance with another embodiment of the present disclosure.

FIG. 2 depicts another embodiment of an electrical device in accordance with the present disclosure. FIG. 2 depicts one embodiment of an electrical device including three semiconductor devices 10, 40, 80 present on a bulk semiconductor substrate 2a, in which data transmission between at least two of the devices, e.g., the first and second semiconductor devices 10, 20, includes an optical interconnect 15, 25, 30. The embodiment depicted in FIG. 2 is similar to the embodiment that has been described above with reference to FIG. 1. Therefore, the description of the structures depicted in FIG. 1 having reference numbers 10, 11a, 11b, 12a, 12b, 14a, 14b, 15, 15a, 15b, 15c, 16a, 16b, 24, 25, 25a, 25b, 25c 26a, 26b, 26c, 26d, 27a, 27b, 27c, 27d, 35, 35a, 35b, 35c and 40 is suitable for the structure depicted in FIG. 2 having the same reference numbers.

The substrate 2a that is depicted in FIG. 2 is a bulk semiconductor substrate. The bulk semiconductor substrate is typically composed entirely of semiconductor material, e.g., does not include the buried dielectric layer of an SOI substrate. In some examples, the bulk semiconductor substrate may be composed of any type IV semiconductor material including, but not limited to Si, strained Si, SiC, SiGe, SiGeC, Si alloys, Ge, Ge alloys and combinations thereof. In other embodiments, the bulk semiconductor substrate may be composed of a type III-V semiconductor material, such as, GaAs, InAs, InP as well as other III/V and II/VI compound semiconductors.

In some embodiments, a first semiconductor device 10 is positioned on a first portion 20 of the substrate 2a and a second semiconductor device 40 positioned on a third portion 45 of the substrate 2a, wherein the first and third portions 20, 45 of the substrate 2a are separated by a second portion 30 of the substrate 2a. In some embodiments, the second portion 30 of the substrate may include a third semiconductor device 80 that is present on the same level, i.e., first level 70, of the electrical device as the first and second semiconductor devices 10, 40. The third semiconductor device 80 is similar to the first and second semiconductor devices 10, 40. It is noted that the portion of the substrate that the third semiconductor device 80 is depicted as being present on is not limited to only some semiconductor device. For example, a plurality of semiconductor and/or memory devices may be present on the portion of the semiconductor substrate that the third semiconductor device 80 is present on.

For example, the third semiconductor device 80 may be any switching or memory type device, as described above. In the embodiment that is depicted in FIG. 2, the third semiconductor device 80 is a field effect transistor (FET) that includes a source region 11c and a drain region 12c on opposing sides of a gate structure 13c. The description of the source regions 11a, 11b, drain regions 12a, 12b, and the gate structures 13a, 13b provided above for the first and second semiconductor devices 10, 40 is suitable for the description of the source region 11c, the drain region 12c and the gate structure 13c of the third semiconductor device 80 that is depicted in FIG. 2. The third semiconductor device 80 may be an n-type or p-type conductivity semiconductor device, e.g., n-type FET or p-type FET. The third semiconductor device 80 may be positioned in the second portion of the substrate 2a underlying the optical interconnect 15, 25, 35. The third semiconductor device 80 is optional, and may be omitted in some embodiments.

At least one interlevel dielectric layer 21a is present on the first, second and third portions 20, 30, 45 of the substrate 2a, wherein the interlevel dielectric layer 21a is present over the first, second and third semiconductor devices 10, 40, 80. In one example, the first, second and third semiconductor devices 10, 40, 80, as well as the vias 26a, 26b, 26e to the first, second and third semiconductor devices 10, 40, 80 may be present in a first level 70 of the electrical device that includes the single interlevel dielectric layer 21a. Although FIG. 2. only depicts a single interlevel dielectric layer 21a present over the first and second semiconductor devices 10, 40, the present disclosure is not limited to only this embodiment.

The second portion 30 of the substrate 2a further includes an optical interconnect 15, 25, 35 that is formed in a second level 75 of the electrical device. The optical interconnect typically includes an optoelectronic light emission device 15, a dielectric waveguide 25, and an optoelectronic light detection device 35. The optical interconnect depicted in FIG. 2 is similar to the optical interconnect that is depicted in FIG. 1. The vias 76 of epitaxial material extend to an upper surface of the bulk substrate 2a, which provides the seed surface for the epitaxial material that provides the base material layer of the optoelectronic light emission device 15, e.g., the first conductivity type III-V semiconductor material layer 15a of the optoelectronic light emission device 15, and provides the base material layer of the optoelectronic light detection device 35, e.g., the first conductivity type III-V semiconductor material layer 35a of the optoelectronic light detection device 35. Different than the embodiment that is depicted in FIG. 1, which includes an SOI substrate 5 and buried dielectric layer 3, in the embodiments formed on a bulk semiconductor substrate 2a, as depicted in FIG. 2, the vias 76 extend to an upper surface of the bulk semiconductor substrate 2a adjacent to the portions of bulk semiconductor substrate 2a that the first, second and third semiconductor devices 10, 40, 80 are formed on. The seed surface of the bulk semiconductor substrate 2a is separated from the portions of the bulk semiconductor substrate 2a by an isolation dielectric material 19.

Still referring to FIG. 2, in some embodiments, the optical interconnect 15, 25, 35 may be formed on a first interlevel dielectric layer 22a within the second level 75 of the electrical device, wherein the first interlevel dielectric layer 22a is present overlying the third semiconductor device 80. The first interlevel dielectric layer 22a of the second level 75 may be formed over the metal lines 27e that are in electrical communication with the third semiconductor device 80. In some embodiments, the first interlevel dielectric layer 22a of the second level 75 does not extend over the first and second semiconductor devices 10, 40. A second interlevel dielectric layer 24 may be present over the first semiconductor device 10, the second semiconductor device 40, and the third semiconductor device 80, as well as being present over the optical interconnect 15, 25, 35.

Figure 3:
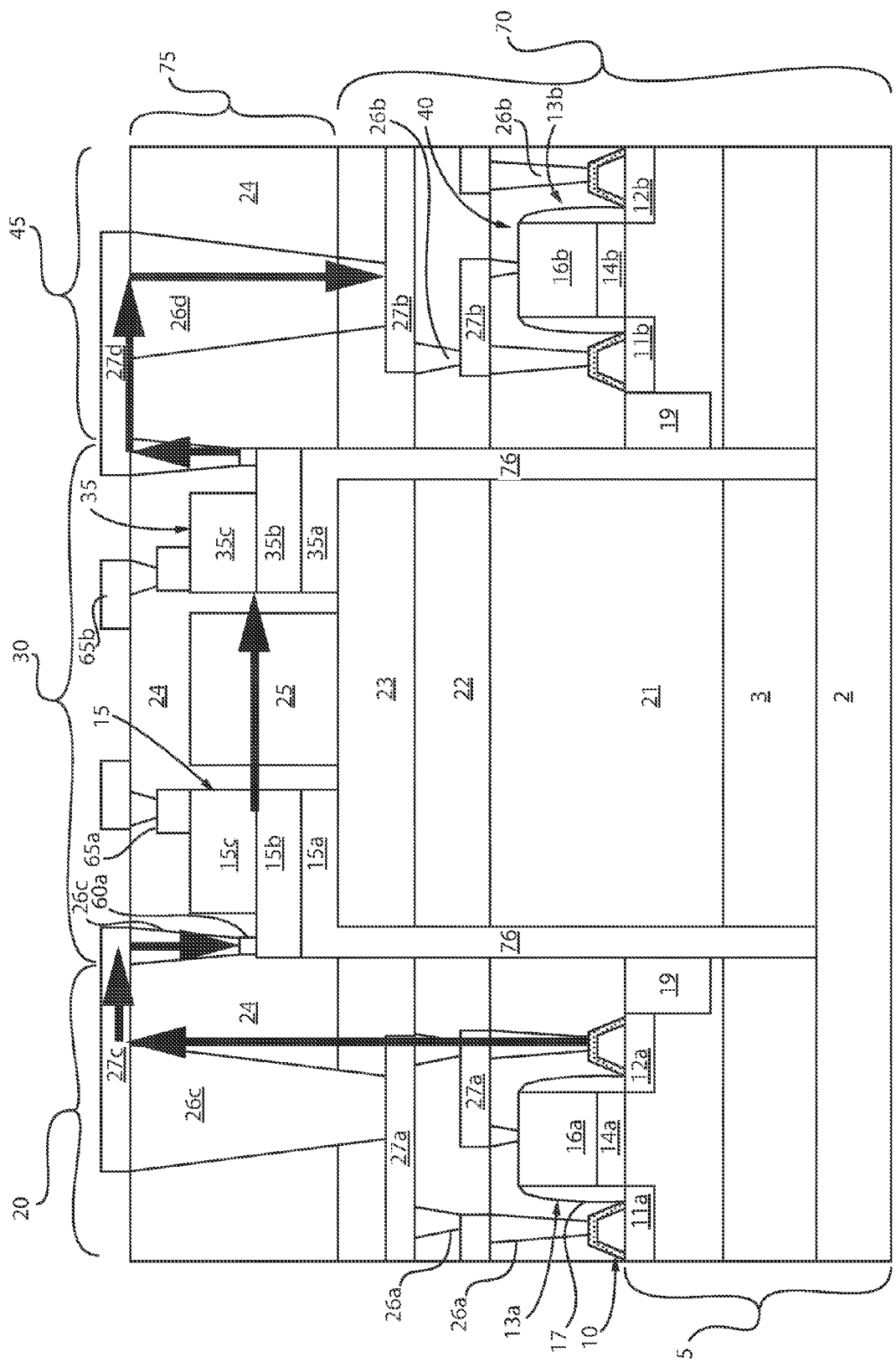
FIG. 3 is a side cross-sectional view depicting one embodiment of data transmission through the electrical device that is depicted in FIG. 1.

FIG. 3 depicts one embodiment of data transmission through the electrical device that is depicted in FIGS. 1 and 2. The combination of the optoelectronic light emission device 15, the dielectric waveguide 15 and the optoelectronic light detection device 35 provide an optical interconnect 15, 25, 35. In the embodiment depicted in FIG. 3, the optoelectronic light emission device 15, the dielectric waveguide 25 and the optoelectronic light detection device 35 provide an optical interconnect for data transmission between the first and second semiconductor devices 10, 40.

In one embodiment, data generated by the first semiconductor device 10 in the first portion 20 of the SOI substrate 5 is transmitted by electrical communication through the vias and interconnects 26a, 26c, 27a, 27c to the optoelectronic light emission device 15. As used herein, the term "electrical communication" means that a first structure or material can conduct electricity, i.e., is electrically conductive, to a second structure or material. Data transmission by electrical communication across the vias and interconnects 26a, 26c, 27a, 27c is depicted by arrows 201, 202, 203 in which the rate of data propagation may range from a few Gb/s, e.g., 1 to 5 Gb/sec to ~50 Gb/sec, e.g., 1 Gb/sec to 25 Gb/sec. The data generated by the first semiconductor device 10 is converted into an optical signal by the optoelectronic light emission device 15, which is typically a high-speed laser. The arrow identified by reference number 204 illustrates the optical transmission of the optical signal being emitted by the optoelectronic light emission device 15 through the dielectric waveguide 25 in the second portion 30 of the SOI substrate 5 to the optoelectronic light detection device 35 in the third portion 45 of the SOI substrate 5.

Optical transmission is faster than electrical communication. For example, optical transmission of the optical signal from the optoelectronic light emission device 15 to the optoelectronic light detection device 35 through the dielectric waveguide 25 may be at a rate ranging from 50 Gb/s (one wavelength channel) to ~400 Gb/s (8 wavelength channel).

The optical signal is received by the optoelectronic light detection device 35 that is present in the third portion 45 of the SOI substrate 5, and is converted by the optoelectronic light detection device 35 from an optical signal to an electrical signal, which is typically a high-speed photodetector. The electrical signal is then transmitted by electrical communication, as depicted by arrows 205, 206, 207, through the vias and interconnects 26b, 26d, 27b, 27d to the second semiconductor device 40 that is present in the third portion 45 of the SOI substrate 5. The rate of data propagation through the vias and interconnects 26b, 27b may range from a few Gb/s, e.g., 1 to 5 Gb/s, to ~50 Gb/s. For example, the rate of data propagation through the vias and interconnects 26b, 27b may range from 1 Gb/s to 25 Gb/s. It is noted that the example depicted in FIG. 3 is provided for illustrative purposes only, and is not intended to limit the present disclosure solely thereto.

It is noted that the above structural and compositional examples described above with reference to FIGS. 1-3 are provided for illustrative purposes only, and are not intended to limit the present disclosure to only the above described examples. For example, the operation of the electrical device has been described above with reference to the embodiment depicted in FIG. 1. The operation of the electrical device is equally applicable to all the embodiments of the present disclosure, such as the embodiments consistent with FIG. 2. The structures and methods of the present disclosure, are now described in more detail with reference to FIGS. 1 to 13.

Figure 4:
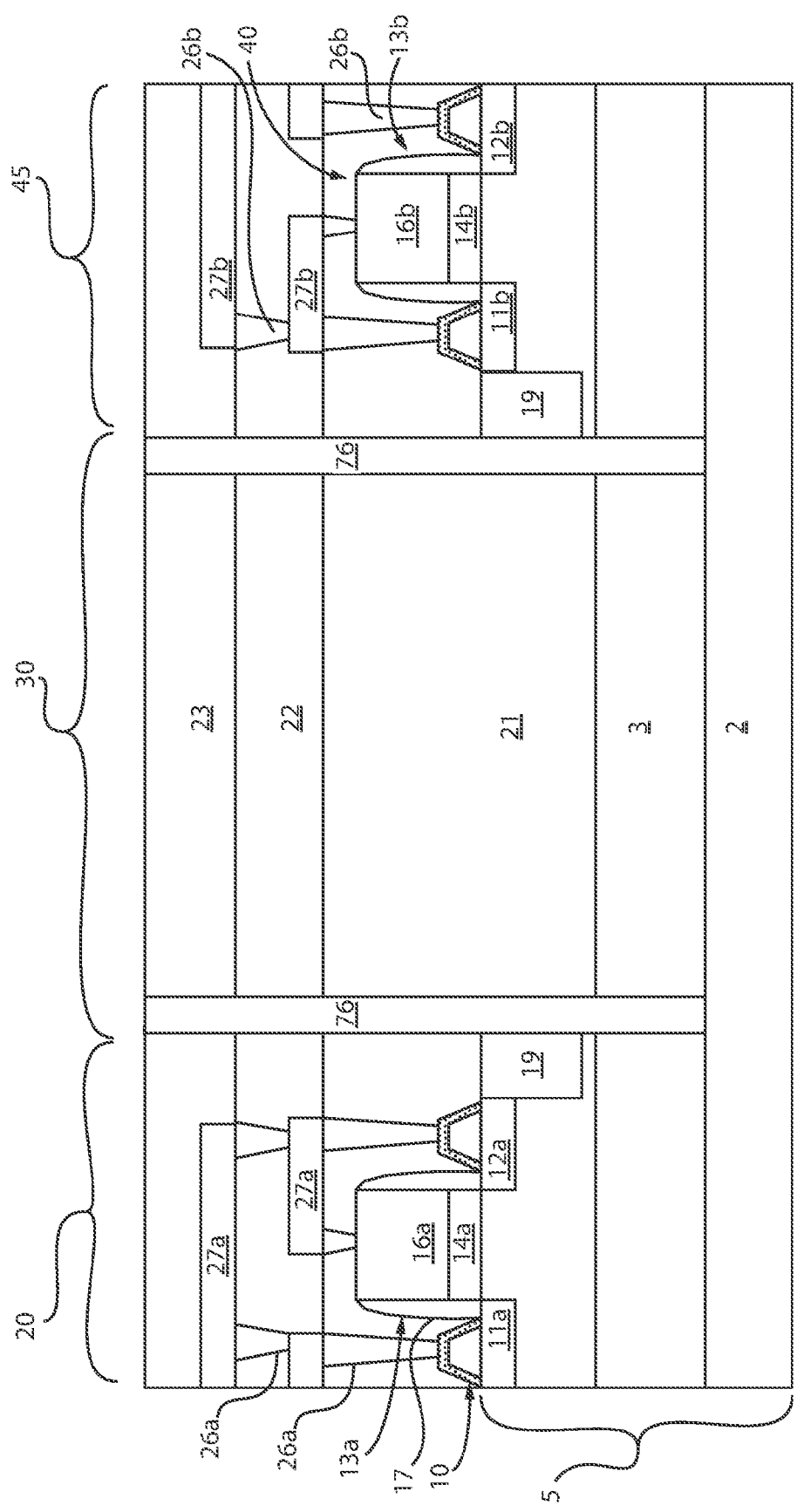
FIG. 4 is a side cross-sectional view depicting semiconductor devices that have been formed on a semiconductor on insulator (SOI) substrate following back end of the line (BEOL) processing, wherein vias have been formed through the at least one interlevel dielectric layer to exposed a seed surface of the SOI substrate, in accordance with one embodiment of the present disclosure.

FIG. 4 depicts one embodiment at least one semiconductor device 10, 40 being formed on an SOI substrate 5 following back end of the line (BEOL) processing. The SOI substrate 5 includes an SOI layer 4, a buried dielectric layer 3, and base semiconductor substrate 2, as described above with reference to FIG. 1. The SOI substrate 5 may be formed by a thermal bonding process, or alternatively, the SOI substrate 5 may be formed by an oxygen implantation process, which is referred to in the art as a separation by implantation of oxygen (SIMOX). In other embodiments, deposition may be used to form the buried dielectric layer 3 on a bulk semiconductor substrate 2. In this embodiment, the SOI layer 4 may then be deposited on the buried dielectric layer 3 to provide the SOI substrate 5.

FIG. 4 depicts one embodiment of patterning the SOI substrate 5 to provide islands of a remaining portion of the SOI layer 4 in the first portion 20 of the SOI substrate 5 and the third portion 45 of the SOI substrate 5. These islands of remaining portions of the SOI layer 4 can provide the site for the formation of the first and second semiconductor devices 10, 40.

Patterning the SOI substrate 5 may include deposition, photolithography and etch processes. Specifically, in one example, a photoresist mask (not shown) is formed overlying the SOI layer 4 of the SOI substrate 5, in which the portion of the SOI layer 4 that is underlying the photoresist mask provides the remaining portion of the SOI layer 4 that is present in the first and third portions 20, 45 of the SOI substrate 5. The exposed portions of the SOI layer 5, which are not protected by the photoresist mask, are removed using a selective etch process. To provide the photoresist mask, a photoresist layer is first positioned on the SOI layer 5. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, a selective etching process may remove the unprotected portions of the SOI layer 4. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material, i.e., SOI layer 4, selectively to a second material, i.e., buried dielectric layer 3, by a ratio of 100:1 or greater.

For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

FIG. 4 also depicts one embodiment of filling the portions of the SOI substrate 5 from which the SOI layer 4 was removed with an isolation dielectric material 19. The isolation dielectric material 19 may be formed using a deposition process. For example, the isolation dielectric material 19 may be deposited using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The isolation dielectric material 19 may also be deposited using chemical solution deposition, spin or deposition, or in some cases may be formed using thermal growth processes, such as thermal oxidation, nitridation or a combination thereof. Following deposition of the isolation dielectric material 19, the structure may be planarized using a planarization process, such as chemical mechanical planarization (CMP).

FIG. 4 also depicts forming the first and second semiconductor devices 10, 40 on the remaining portions of the SOI layer 4 in the first portion 20 and the third portion 45 of the SOI substrate 5. In some embodiments, the first and second semiconductor devices 10, 40 may be composed of FETS. One example of a process sequence for forming a FET device includes depositing a layered stack including at least one gate dielectric material and at least on gate conductor material, and patterning and etching the layered stack to provide a gate structure 13a, 13b. At least one gate sidewall spacer 17 may then be formed on the sidewall of the gate structure 13a, 13b using deposition and etch back methods. Source and drain regions 11a, 11b, 12a, 12b may be formed in the SOI layer 4 on opposing sides of the gate structures 13a, 13b by ion implantation of an n-type or p-type dopant. In some embodiments, raised source and drain regions structures may be formed. Block masks, e.g., photoresist block masks, may be employed to selectively process the first and third portions 10, 45 of the SOI substrate 5 so that the first and second semiconductor devices 10, 40 may be devices of a different conductivity, e.g., n-type conductivity FET or p-type conductivity FET. Following the formation of the first and second semiconductor devices 10, 40, the dielectric material 19 may be removed from the third portion 30 of the SOI substrate 5, in which the optical interconnect 15, 25, 35 is later formed. The dielectric material 19 may be removed from the third portion 30 of the SOI substrate 5 using deposition, photolithography, and etch processing.

Still referring to FIG. 4, a first interlevel dielectric layer 21 may be blanket deposited covering the entirety of the SOI substrate 5 including the first and second semiconductor devices 10, 40. The first interlevel dielectric layer 21 may be deposited using a chemical vapor deposition process, such as metal organic chemical vapor deposition, high density plasma chemical vapor deposition, or plasma enhanced chemical vapor deposition. Following deposition of the first interlevel dielectric layer 21, via openings may be formed through the interlevel dielectric layer to the source region 11a, 11b, drain region 12a, 12b, and the gate structures 13a, 13b. The via openings may be formed using photolithography and etch processes. The via openings may be filled with a conductive material, such as a metal, to provide a first set of electrically conductive vias 26a, 26b. The conductive material may be deposited using a physical vapor deposition (PVD) process, such as plating or sputtering. Electrically conductive lines 27a, 27b may then be formed on the first interlevel dielectric layer 21, and may be in electrically communication with the first set of vias 26a, 26b. The electrically conductive lines 27a, 27b may be composed of an electrically conductive material that is similar to the electrically conductive material of the vias 26a, 26b. The electrically conductive lines 27a, 27b may be formed using physical vapor deposition and selective etch processing.

A second interlevel dielectric layer 22 may then be blanket deposited atop the first interlevel dielectric layer 21. A second set of electrically conductive vias 26a, 26b may then be formed through the second interlevel dielectric layer 22 and a second set of electrically conductive lines 27a, 27b may be formed atop the second interlevel dielectric layer 22. The second set of electrically conductive vias 26a, 26b may be in electrical communication with the electrically conductive lines 27a, 27b that are present on the first interlevel dielectric layer 21. A third interlevel dielectric layer 23 may be formed atop the second interlevel dielectric layer 22.

Following formation of the third interlevel dielectric layer 23, vias 76 may be formed through the first, second and third interlevel dielectric layer 21, 22, 23, as well as the buried dielectric layer 3, to expose the seed portion of the base semiconductor substrate 2. For example, the via 76 may be formed using deposition, photolithography and etch processes similar to the above described process sequence for etching the SOI layer 4. More specifically, an etch mask, i.e., photoresist mask, is formed exposing the portion of the dielectric material layers that are to be etched to expose the underlying surface of the base semiconductor substrate 2 that provides the seed surface for epitaxial growth. Thereafter, an etch process etches the exposed portions of the first second and third dielectric layers 21, 22, 23, as well as the buried dielectric layer 3, selectively to at least the base semiconductor substrate 2 and the etch mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material, i.e., buried dielectric layer 3, selectively to a second material, i.e., base semiconductor substrate, by a ratio of 100:1 or greater. The etch process may be an anisotropic etch process, such as reactive ion etch (RIE). Other anisotropic etch processes that are suitable at this stage of the present disclosure include ion beam etching, plasma etching or laser ablation. In some embodiments, at least one via 76 is formed to adjacent to the first semiconductor device 10, and at least one via 76 is formed adjacent to the second semiconductor device 40. In some embodiments, the first via 76 adjacent to the first semiconductor device 10 exposes a first seed surface of the base semiconductor substrate 2 that provides for epitaxial growth for the base layer, i.e., first conductivity type III-V semiconductor material layer 15a of the optoelectronic light emission device 15, and the second via 76 adjacent to the second semiconductor device exposes a second seed surface of the base semiconductor substrate 2 that provides for epitaxial growth for the base layer, i.e., first conductivity type III-V semiconductor material layer 35a of the optoelectronic light detection device 35.

Figure 5:
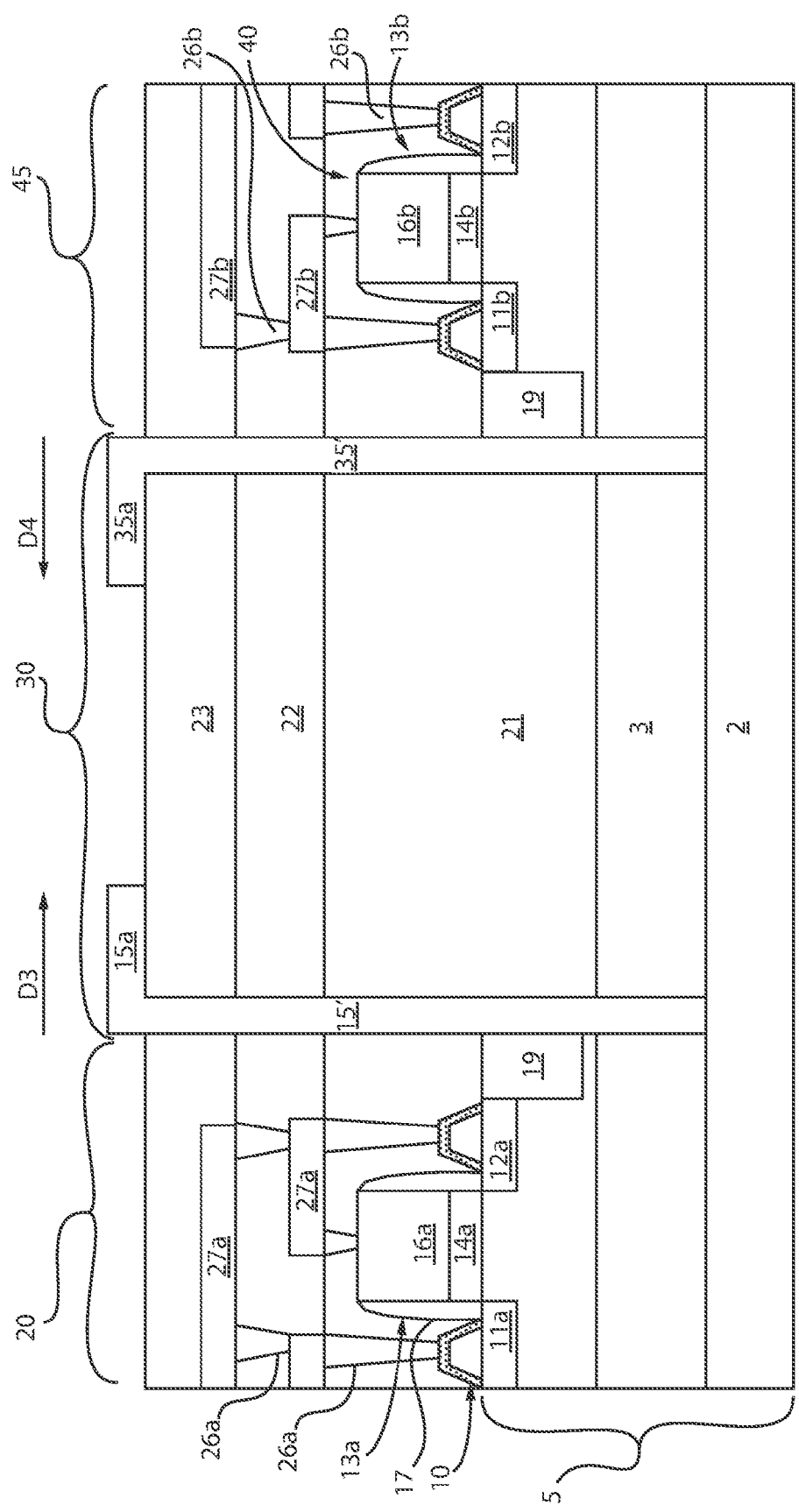
FIG. 5 is a side cross-sectional view depicting epitaxially forming a III-V semiconductor material from the seed surface of SOI substrate, wherein the III-V semiconductor material fills the vias and provides at least a base material layer for the optoelectronic light emission device and/or optoelectronic light detecting device of an optical interconnect, in accordance with one embodiment of the present disclosure.

FIG. 5 depicts one embodiment of epitaxially forming a III-V semiconductor material from the seed surface of SOI substrate 5, wherein the III-V semiconductor material fills the vias 76, and provides at least a base material layer for the optoelectronic light emission device 15 and/or optoelectronic light detection device 35 for the optical interconnect. More specifically, FIG. 5 depicts epitaxially forming the first conductivity type III-V semiconductor material layer 15a for the optoelectronic light emission device 15 from the first seed surface within the via 76 adjacent to the first semiconductor device 10, and epitaxially forming the first conductivity type III-V semiconductor material layer 35a for the optoelectronic light detection device 35 from the second seed surface within the via 76 adjacent to the second semiconductor device 40. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

The first conductivity type III-V semiconductor material layer 15a of the optoelectronic light emission device 15, and the first conductivity type III-V semiconductor material layer 35a of the optoelectronic light detection device 35, is typically doped to a first conductivity type. For example, the first conductivity III-V semiconductor material layers 15a, 35a may be doped to an n-type conductivity. In other examples, the first conductivity type III-V semiconductor material layers 15a, 35a may be doped to a p-type conductivity. The dopant may be introduced via ion implantation or via in situ implantation. The effect of the dopant atom, i.e., whether it is a p-type or n-type dopant, depends upon the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

It is noted that it is not necessary that the first conductivity type III-V semiconductor material layer 15a for the optoelectronic light emission device 15 and the first conductivity type III-V semiconductor material layer 35a for the optoelectronic light detection device 35 be formed simultaneously, or have the same composition, or have the same conductivity type. Block masks may be employed to independently process the first conductivity type III-V semiconductor material layer 15a for the optoelectronic light emission device 15 and the first conductivity type III-V semiconductor material layer 35a for the optoelectronic light detection device 35.

Following deposition, the first conductivity type III-V semiconductor material layers 15a, 35a are planarized. Planarization may include chemical mechanical planarization (CMP) or grinding.

The first conductivity type III-V semiconductor material layers 15a, 35a are typically grown filling the vias 76, and extending over the upper surface of the third interlevel dielectric layer 23. The first conductivity type III-V semiconductor material layers 15a, 35a of the optical interconnect are typically grown to a thickness ranging from 1 micron to 2 microns, as measured from the upper surface of the third interlevel dielectric layer 23. The portion of the first conductivity type III-V semiconductor material layers 15a, 35a that are present in the vias 76 may have a high defect density. For example, the defect density of the III-V semiconductor material within the vias 76 may range from $10^7$ defects/$cm^3$ to $10^{11}$ defects/$cm^3$. In another example, the defect density of the III-V semiconductor material within the vias 76 may range from $10^9$ defects/$cm^3$ to $10^{10}$ defects/$cm^3$. The high defect density may be contained within the vias 76 in accordance with the principles of high aspect ratio defect trapping. More specifically, the high defect density of the III-V semiconductor material layer having a high defect density may be contained within the vias 76 having an aspect ratio (i.e., height to width ratio) being greater than 1:1, e.g., greater than 2:1.

The defect density within the first conductivity type III-V semiconductor material layers 15a, 35a reduces along the distance D3, D4 away from the via 76. For example, at a distance D3, D4 of 50 nm from the sidewall of the via 76, the defect density within the first conductivity type III-V semiconductor material layers 15a, 35a may be reduced to $10^6$ defects/cm$^3$. In another example, at a distance D3, D4 of 50 nm from the sidewall of the via 76, the defect density within the first conductivity type III-V semiconductor material layers 15a, 35a may be reduced to $10^6$ defects/cm$^3$. Typically, the farther away from the via 27, the lower the defect density in the first conductivity type III-V semiconductor material layers 15a, 35a.

The portion of the first conductivity type III-V semiconductor material layers 15a, 35a that is present extending over the upper surface of the third interlevel dielectric layer 23 is typically etched to provide the base geometry of the optoelectronic light emission device 15 and the optoelectronic light detection device 35. To provide the base geometry of the optoelectronic light emission device 15, and the optoelectronic light detection device 35, the first conductivity type III-V semiconductor material layers 15a, 35a are typically etched using photolithography and selective etch processing to provide the width W3, W4 and length dimensions L2, L3 that are described above with reference to FIG. 8.

Figure 6:
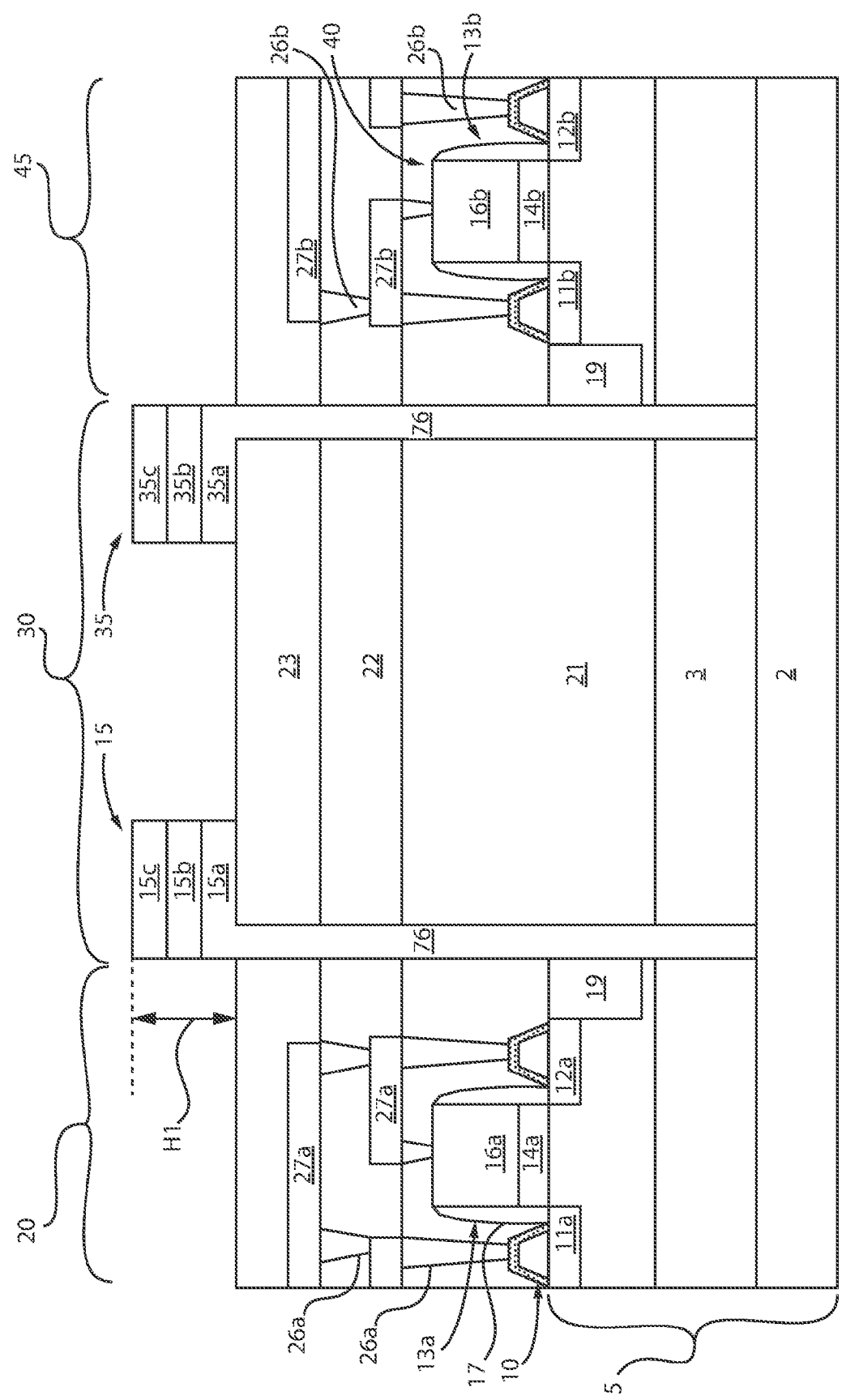
FIG. 6 is a side cross-sectional view depicting forming an optoelectronic light emission device comprising a type III-V semiconductor materials and the optoelectronic light detection device comprising III-V semiconductor materials on the epitaxially grown III-V semiconductor material layers depicted in FIG. 5, in accordance with one embodiment of the present disclosure.

FIG. 6 depicts one embodiment of forming an optoelectronic light emission device 15 including the first conductivity type III-V semiconductor material layer 15a, and forming an optoelectronic light detection device 35 including the first conductivity type III-V semiconductor material layer 35a. In some embodiments, following formation of the first conductivity type III-V semiconductor material layer 15a of the optoelectronic light emission device 15, the material layers of the III-V multiple quantum well layered stack 15b may be epitaxially formed on the first conductivity type III-V semiconductor material layer 15a, which may provide the base layer of the optoelectronic light emission device 15. The III-V multiple quantum well layered stack 15b is typically a layered stack of intrinsic semiconductor materials. Each material layer of the III-V multiple quantum well layered stack 15b can be formed using an epitaxial deposition process, which may be carried out in the deposition chamber of a CVD apparatus. The epitaxial deposition process for forming the III-V multiple quantum well layered stack 15b may be a selective epitaxial deposition process. The fact that the process is selective means that the III-V semiconductor material only on forms on the exposed semiconductor surfaces, such as the upper surface of the first conductivity type III-V semiconductor material layer 15a of the optoelectronic light emission device, and is not formed on dielectric surfaces, such as the uppermost third interlevel dielectric layer 23. The different compositions of the III-V multiple quantum well layered stack 15b may be provided by changing and cycling the precursor gasses used in depositing the different compositions of the III-V compound semiconductor materials for the different layers within the III-V multiple quantum well layered stack 15b.

In some embodiments, the intrinsic III-V semiconductor material layer 35b of the optoelectronic light detection device 35 may be epitaxially formed concurrently with the III-V multiple quantum well layered stack 15b of the optoelectronic light emission device 15. In this embodiment, the intrinsic III-V semiconductor material layer 35b has the same composition as the III-V multiple quantum well layered stack 15b. In other embodiments, the intrinsic III-V semiconductor material layer 35b of the optoelectronic light detecting device 35 is epitaxially formed separately from the III-V multiple quantum well layered stack 15b of the optoelectronic light emission device 15 by employing block masks to independently epitaxially deposit III-V semiconductor material layers for the optoelectronic light emission device 15 and the optoelectronic light detection device 35.

Following the formation of the III-V multiple quantum well layered stack 15b of the optoelectronic light emission device 15 and/or the intrinsic III-V semiconductor material layer 35b of the optoelectronic light detection device 35, at least one of the second conductivity type III-V semiconductor material layer 15c of the optoelectronic light emission device 15 and the second conductivity type III-V semiconductor material layer 35c of the optoelectronic light detection device 35 may be epitaxially formed. The second conductivity type III-V semiconductor material layer 15c is formed epitaxially on an upper surface of the III-V multiple quantum well layered stack 15b of the optoelectronic light emission device 15. The second conductivity III-V semiconductor material layer 35c is epitaxially formed on an upper surface of the intrinsic III-V semiconductor material layer 35b of the optoelectronic light emission device 35.

Each of the second conductivity type III-V semiconductor material layer 15c that is epitaxially formed on the III-V multiple quantum well layered stack 15b, and the second conductivity type III-V semiconductor material layer 35c that is epitaxially formed on the intrinsic III-V semiconductor material layer 35b, may have a conductivity type that is opposite the conductivity type of the first conductivity type III-V semiconductor material layer 15a and the first conductivity type III-V semiconductor material layer 35a, respectively. For example, when the first conductivity type III-V semiconductor material layer 15a has an n-type conductivity, the second conductivity type III-V semiconductor material layer 15c has a p-type conductivity.

Each of the second conductivity type III-V semiconductor material layer 15c that is epitaxially formed on the III-V multiple quantum well layered stack 15b, and the second conductivity type III-V semiconductor material layer 35c that is epitaxially formed on the intrinsic III-V semiconductor material layer 35b, may be formed using an epitaxial deposition process that is similar to the process described above for forming the first conductivity III-V semiconductor material layer 15a and the first conductivity III-V semiconductor material layer 35a. The dopant of the second conductivity type III-V semiconductor material layer 15c and/or second conductivity type III-V semiconductor material layer 35c may be introduced in-situ or may be introduced to the III-V semiconductor material by ion implantation.

In one embodiment, the second conductivity type III-V semiconductor material layer 15c and the second conductivity type III-V semiconductor material layer 35c have the same composition. In other embodiments, the second conductivity type III-V semiconductor material layer 35c of the optoelectronic light detection device 35 is epitaxially formed separately from the second conductivity type III-V material layer 15c of the optoelectronic light emission device 15 by employing block masks. Following formation of the second conductivity type III-V semiconductor material layer 15c of the optoelectronic light emission device 15 and/or second conductivity type III-V semiconductor material layer 35c of the optoelectronic light detection device 35, the height H1 of the materials stacks for the optoelectronic light emission device 15 and the optoelectronic light detection device 35 may range from 500 nm to 5000 nm, as measured from the upper surface of the third interlevel dielectric layer 23.

Figure 7:
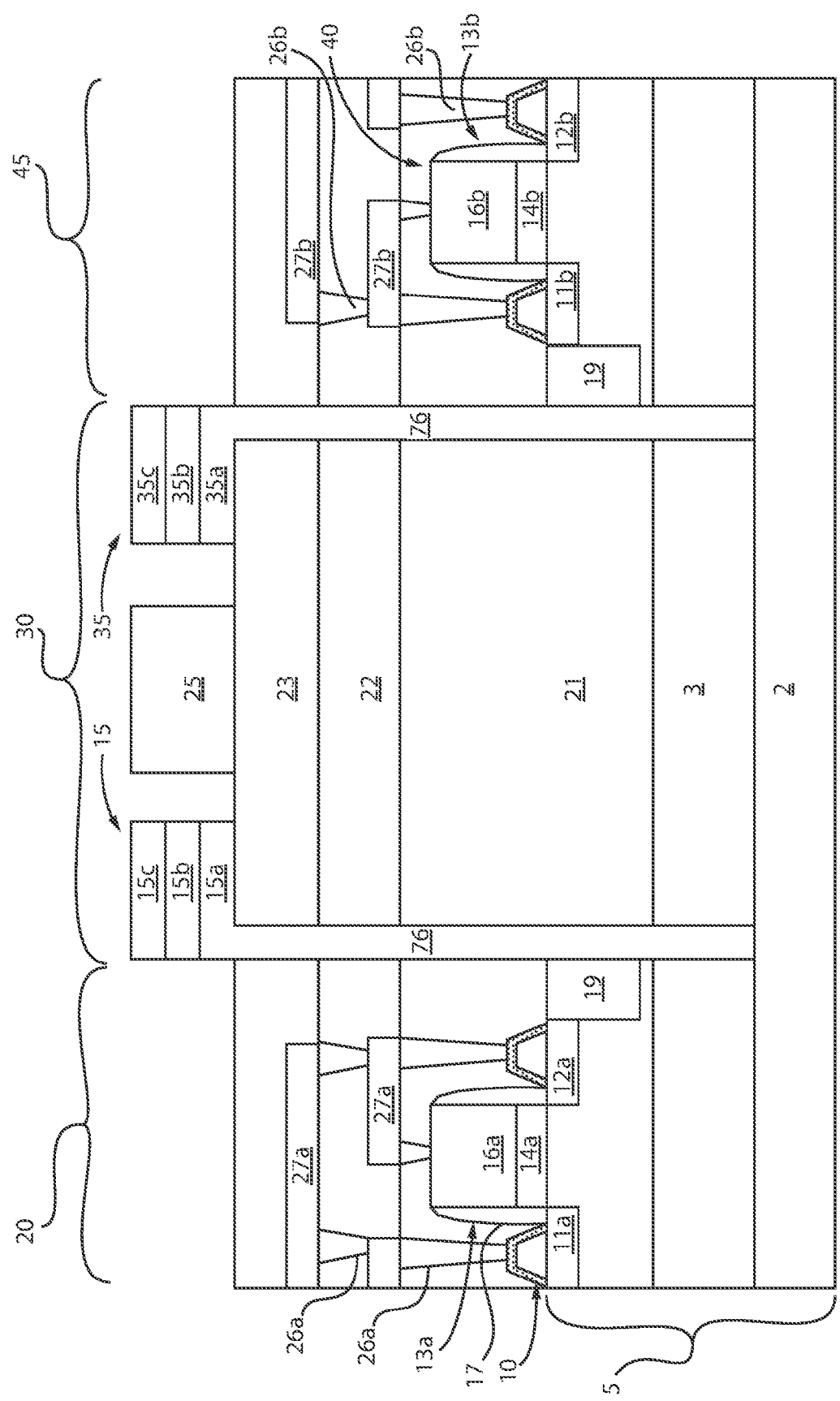
FIG. 7 is a side cross-sectional view depicting one embodiment of forming a dielectric waveguide, in accordance with the present disclosure.

FIG. 7 depicts one embodiment of forming a dielectric waveguide 25 on the third interlevel dielectric layer 23 between the optoelectronic light emission device 15 and the optoelectronic light detection device 35. In some embodiments, the dielectric material for the dielectric waveguide 25 may be deposited on the structure depicted in FIG. 6 using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric material may also be deposited using chemical solution deposition, spin or deposition, or in some cases may be formed using thermal growth processes, such as thermal oxidation, nitridation or a combination thereof.

The dielectric material may then be patterned and etched to provide a dielectric waveguide 25 having the geometry depicted in FIG. 8. Patterning the dielectric material may include deposition, photolithography and etch processes. Specifically, in one example, a photoresist mask (not shown) is formed overlying the dielectric material, in which the portion of the dielectric material that is underlying the photoresist mask provides the dielectric waveguide 25. The exposed portions of the dielectric material, which are not protected by the photoresist mask, are removed using a selective etch process. Following the formation of the photoresist mask, an etching process may remove the unprotected portions of the dielectric material. For example, the transferring of the pattern provided by the photoresist into the underlying structures may include an anisotropic etch. The anisotropic etch may include reactive-ion etching (RIE). Other examples of anisotropic etching that can be used at this point of the present disclosure include ion beam etching, plasma etching or laser ablation.

Referring to FIG. 1, in a following process step, contacts 60a, 60b, 65a, 65b are formed to the optoelectronic light emission device 15 and the optoelectronic light detection device 35. In some embodiments, a first contact 60a, 60b may be formed to each of the first conductivity type III-V semiconductor material layer 15a of the optoelectronic light emission device 15, and the first conductivity type III-V semiconductor material layer 35a of the optoelectronic light detection device 35. In some embodiments, a second contact 65a, 65b may be formed to each of the second conductivity III-V semiconductor material layer 15c of the optoelectronic light emission device 15, and the second conductivity III-V semiconductor material layer 35c of the optoelectronic light detection device 35.

Forming the contacts 60a, 60b, 65a, 65b may begin with patterning the second conductivity type III-V semiconductor material layers 15c, 35c, the III-V multiple quantum well layered stack 15b and the intrinsic III-V semiconductor material layer 35b to expose a portion of the each of the first conductivity type III-V semiconductor material layer 15a of the optoelectronic light emission device 15 and the first conductivity type III-V semiconductor material layer 35a of the optoelectronic light detection device 35. Patterning the layered material stacks for the optoelectronic light emission device 15 and the optoelectronic light detection device 35 may include photolithography and etch processes.

The contacts 60a, 60b, 65a, 65b may be composed of a metal, which can be deposited using a physical vapor deposition (PVD) method, such as a sputtering or plating. The material layer for the contacts 60a, 60b, 65a, 65b may be deposited as a single blanket deposited layer. Following deposition, the material layer for the contacts 60a, 60b, 65a, 65b may be patterned and etched so that remaining portions are present in direct contact with the first and second conductivity type III-V material layers 15a, 35a, 15c, 35c of the optoelectronic light emission device 15 and the optoelectronic light detection device 35.

In some embodiments, following the formation of the contacts 60a, 60b, 65a, 65b, a fourth interlevel dielectric layer 24 may be formed over the structure including the optoelectronic light emission device 15, the optoelectronic light detection device 35, and the dielectric wave guide 25. The fourth interlevel dielectric layer 24 may be formed by chemical vapor deposition (CVD), spin on coating, solution deposition or other deposition methods.

In some embodiments, interconnect wiring, i.e., vias 26c and lines 27c, may be formed to provide electrical communication between the first semiconductor device 10 and the optoelectronic light emission device 15. Interconnect wiring, i.e., vias 26d and lines 27d, may also be formed to provide electrical communication between the second semiconductor device 40 and the optoelectronic light detection device 35. The fourth interlevel dielectric 24 and the third interlevel dielectric 23 on the first and third portions 10, 45 of the SOI substrate 5 may be patterned and etched to form via holes to the various contacts 60a, 60b, 65a, 65b of the optoelectronic light emission device 15 and the optoelectronic light detection device 35, as well as to the lines 27a, 27b that are in electrical communication with the first and second semiconductor devices 10, 40. Following via formation, interconnects 27c, 27d are formed by depositing a conductive metal into the via holes using deposition methods, such as CVD, sputtering or plating. A first line 27c may then be formed to provide electrical communication between the vias 26c to the first semiconductor device 10 and the vias 26c to the optoelectronic light emission device 15. A second line 27d may then be formed to provide electrical communication between the vias 26d to the second semiconductor device 40 and the vias 26d to the optoelectronic light detection device 35.

FIG. 9 depicts semiconductor devices 10, 40, 90 that have been formed on a bulk semiconductor substrate 2a following back end of the line (BEOL) processing, wherein vias 76 have been formed through interlevel dielectric layers 21a to expose a seed surface of the bulk substrate 2a. In this embodiment, three semiconductor devices 10, 40, 80 are formed on the upper surface of a bulk semiconductor substrate 2a. Isolation between adjacent semiconductor devices 10, 40, 80 is provided by shallow trench isolation (STI) regions provided by an isolation dielectric material 19. Seed surfaces for epitaxial growth are present between the portions of the bulk substrate 2a that are occupied by the semiconductor devices 10, 40, 80. The process steps that provide the semiconductor devices 10, 40, 80 and isolation dielectric material 19 that is depicted in FIG. 9 is similar to the process steps that provide the semiconductor devices 10, 40, 80 and isolation dielectric material 19 that are described above with reference to FIG. 4. Following the formation of the semiconductor devices 10, 40, 80, a first interlevel dielectric layer 21a is formed over the bulk semiconductor substrate 2a and the semiconductor devices 10, 40, 80. Vias 26a, 26b, 26e are then formed to the semiconductor devices 10, 40, 80. Metal lines 27e may then be formed to provide electrical communication to the third semiconductor device 80.

Figure 10:
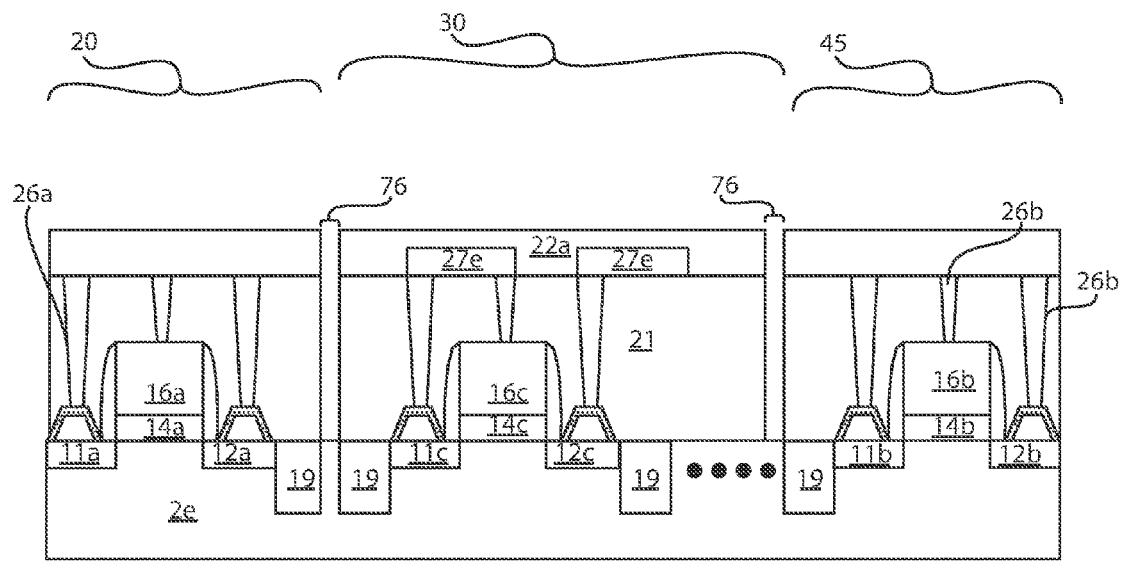
FIG. 10 is a side cross-sectional view depicting patterning the interlevel dielectric layers depicted in FIG. 9 to a provide vias extending to a seed surface portion of the bulk semiconductor substrate, in accordance with one embodiment of the present disclosure.

FIG. 10 depicts forming a second interlevel dielectric layer 22a overlying the structure depicted in FIG. 9, and patterning the interlevel dielectric layers 21a, 22a to provide vias 76 extending through the interlevel dielectric layers 21 to expose seed surface portions of the bulk semiconductor substrate 2a. The process sequence for forming the vias 76 depicted in FIG. 10 is similar to the process sequence that has been described above for forming the vias 76 depicted in FIG. 4.

Figure 11:
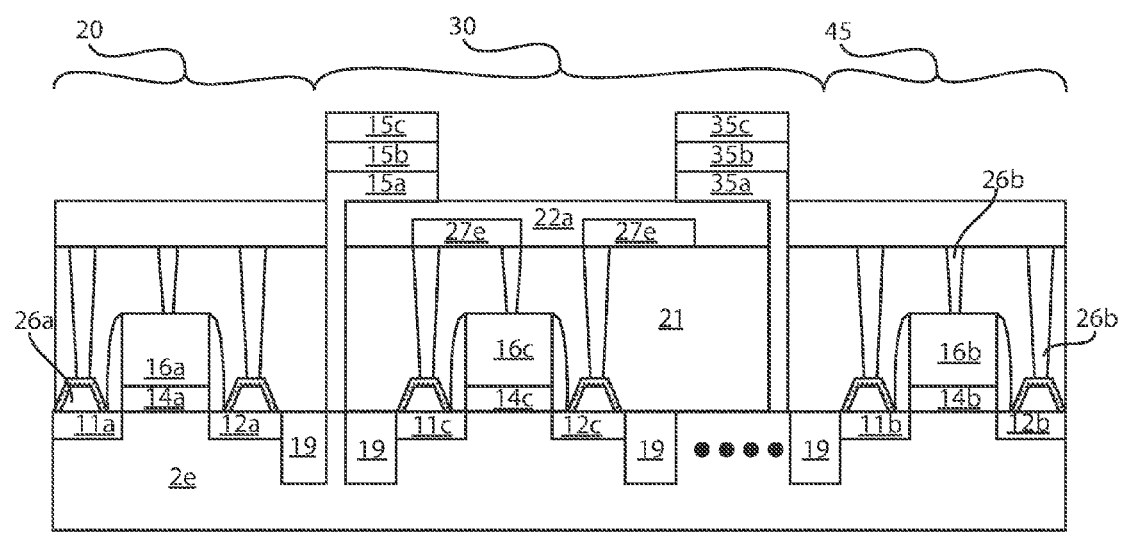
FIG. 11 is a side cross-sectional view depicting epitaxially forming an optoelectronic light emission device, and an optoelectronic light detection device, wherein at least one material layer of at least one of the optoelectronic light emission device and the optoelectronic light detection device is epitaxial grown from the seed surface of the substrate.

FIG. 11 depicts epitaxially forming an optoelectronic light emission device 15, and an optoelectronic light detection device 35, wherein at least one material layer of at least one of the optoelectronic light emission device 15 and the optoelectronic light detection device 35 is epitaxially grown from the seed substrate surface through at least one via 76 extending onto the upper surface of the second interlevel dielectric layer 22a. The process sequence for forming the III-V light emission device 15 and the III-V light detection device 35 that is depicted in FIG. 11 is similar to the process sequence that is used to form the III-V light emission device 15 and the III-V light detection device 35 that has been described above with reference to FIGS. 5 and 6.

Figure 12:
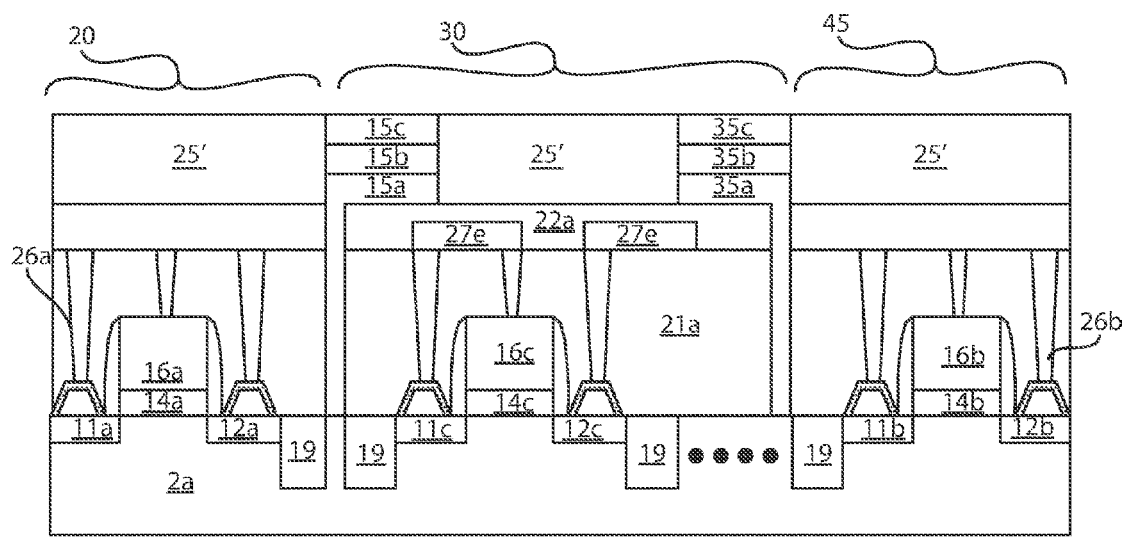
FIG. 12 is a side cross-sectional view depicting forming the dielectric material for the dielectric waveguide on the structure depicted in FIG. 11.

FIG. 12 depicting forming the dielectric material 25' for the dielectric waveguide on the structure depicted in FIG. 11. The dielectric material 25' is blanket deposited and then planarized so that the upper surface of the dielectric material 25' is coplanar with the upper surface of the III-V light emission device 15 and the III-V light detection device 35.

Figure 13:
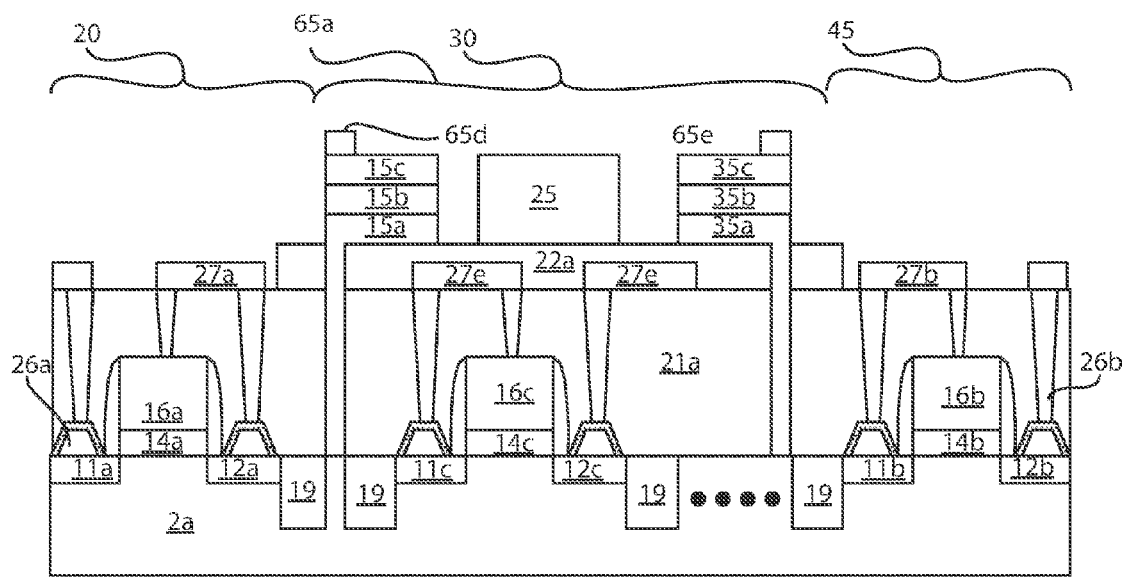
FIG. 13 is a side cross-sectional view depicting pattering the dielectric material layer depicted in FIG. 12 to provide a dielectric wave guide, in accordance with one embodiment of the present disclosure.

FIG. 13 depicting pattering the dielectric material layer 25' depicted in FIG. 12 to provide a dielectric wave guide 25. The dielectric wave guide 25 may have a tapered geometry, as described with reference to FIG. 8. The process for patterning the dielectric waveguide 25 from the dielectric material layer 25' has been described above with reference to FIGS. 7 and 8.

Following patterning of the dielectric waveguide 25, the second interlevel dielectric layer 22 may be etched to remove the portions that are extending over the first and second semiconductor devices 10, 40. Contacts 65a, 65e may then be formed to the III-V light emission device 15 and the III-V light detection device 35. For the purposes of clarity the back contact to III-V light emission device 15 and the III-V light detection device 35 are not depicted in FIG. 13. The contact scheme for the structure depicted in FIG. 13 may be similar to the contact scheme that is depicted in FIG. 1. Further, metal lines 27a, 27b may be formed in electrical communication with the vias 26a, 26b to the first and second semiconductor devices 10, 40.

Referring to FIG. 2, an interlevel dielectric layer 24 may then be blanket deposited on the structure depicted in FIG. 13 that covers the III-V light emission device 15, the dielectric waveguide 25 and the III-V light detection device 35. Metal lines and vias 26a, 26d, 27c, 27d may then be formed providing electrical communication between the III-V light emission device 15, and the first semiconductor device 10, and electrical communication between the III-V light detection device 35 and the second semiconductor device 40.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An electrical device comprising:
a first electrical component positioned on a first portion of a semiconductor on insulator (SOI) substrate;
a second electrical component positioned on a third portion of the SOI substrate; and
an optical interconnect positioned on a second portion of the semiconductor substrate that is positioned between the first and third portions of the semiconductor substrate, the optical interconnect is present on at least one interlevel dielectric layer that is present over at least one of the first and second electrical components, the optical interconnect including a III-V light emission device and a III-V light detection device, wherein at least one material layer of at least one of the III-V light emission device and the III-V light detection device is an epitaxial material that is in direct contact with a semiconductor material layer of the SOI substrate.

2. The electronic device of claim 1 further comprising a dielectric waveguide positioned between the III-V light emission device and the III-V light detection device.

3. The electronic device of claim 1, wherein the first electronic component comprises a switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET) and combinations thereof, or the first electronic component comprises a memory device selected from the group consisting of flash memory, dynamic random access memory, embedded dynamic random access memory, and combinations thereof.

4. The electronic device of claim 1, wherein the second electronic component comprises a switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET) and combinations thereof, or the second electronic component comprises a memory device selected from the group consisting of flash memory, dynamic random access memory, embedded dynamic random access memory and combinations thereof.

5. The electronic device of claim 1, wherein the III-V light emission device is a quantum well laser comprising a first conductivity type III-V semiconductor material layer, a quantum well stack of III-V semiconductor material layers that is present on the first conductivity type III-V semiconductor material layer, and a second conductivity type III-V semiconductor material layer that is present on the quantum well stack of III-V semiconductor material layers.

6. The electronic device of claim 1, wherein the III-V light detection device includes a first conductivity type III-V semiconductor material layer, an intrinsic III-V semiconductor material layer, and a second conductivity type III-V semiconductor material layer.

7. The electronic device of claim 1, wherein the first electronic component is in electrical communication through at least one first interconnect to the III-V light emission device of the optical interconnect, and the second electronic component is in electrical communication through at least one second interconnect to the III-V light detection device of the optical interconnect.

8. The electrical device of claim 2, wherein the dielectric waveguide has a width that tapers from a first face having a first width that is adjacent to the III-V light emission device to a second face having a second width that is adjacent to the III-V light detection device.

9. The electrical device of claim 8, wherein the dielectric waveguide is comprised of a dielectric material selected from the group consisting of amorphous silicon, polysilicon, poly III-V semiconductor material, aluminum nitride (AlN) and a combination thereof.

10. An electrical device comprising:
    a semiconductor device positioned on a portion of a substrate;
    an interlevel dielectric layer present over the semiconductor device; and
    an optical interconnect positioned on the interlevel dielectric and in communication with the semiconductor device, the optical interconnect including an epitaxial material that is in direct contact with a seed surface of the substrate through a via extending through the least one interlevel dielectric layer.

11. The electrical device of claim 10, wherein the optical interconnect includes a III-V light emitting device, a dielectric waveguide and a III-V light detecting device.

12. The electrical device of claim 10, wherein the semiconductor device comprises a first switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET) and combinations thereof, or the semiconductor device comprises a first memory device selected from the group consisting of flash memory, dynamic random access memory, embedded dynamic random access memory and combinations thereof.

13. The electrical device of claim 11, wherein the optoelectronic light emission device is a quantum well laser comprising a first conductivity type III-V semiconductor material layer, a quantum well stack of III-V semiconductor material layers that is present on the first conductivity type III-V semiconductor material layer, and a second conductivity type III-V semiconductor material layer that is present on the quantum well stack of III-V semiconductor material layers.

14. The electrical device of claim 11, wherein the optoelectronic light detector device comprises a first conductivity type III-V semiconductor layer, an intrinsic III-V semiconductor material layer, and a second conductivity type III-V semiconductor material layer.

15. A method of forming an electrical device comprising:
    forming a first electrical component on a first portion of a substrate, and a second electrical component on a third portion of the substrate, wherein the first and third portions of the substrate are separated by a second portion of the substrate; and
    forming an optical interconnect on a surface of the at least one interlevel dielectric layer overlying the first and second electrical components, wherein at least one material layer of the optical interconnect is epitaxial grown from the seed substrate surface through at least one via extending onto the upper surface of the at least one interlevel dielectric layer.

16. The method of claim 15 further comprising depositing at least one interlevel dielectric layer over the first, second and third portions of the substrate.

17. The method of claim 16 further comprising etching at least one via through the at least one interlevel dielectric layer to expose the seed substrate surface in the second portion of the substrate.

18. The method of claim 15, wherein the optical interconnect includes a III-V light emitting device, a dielectric waveguide and a III-V light detecting device.

19. The method of claim 15, wherein at least one of the III-V light emitting device and the III-V light detecting device is a quantum well laser comprising a first conductivity type III-V semiconductor material layer, a quantum well stack of III-V semiconductor material layers that is present on the first conductivity type III-V semiconductor material layer, and a second conductivity type III-V semiconductor material layer that is present on the quantum well stack of III-V semiconductor material layers.

20. The method of claim 15, wherein at least one of the III-V light emitting device and the III-V light detecting device comprises a first conductivity type III-V semiconductor layer, an intrinsic III-V semiconductor material layer, and a second conductivity type III-V semiconductor material layer.

* * * * *